US009361423B2

(12) United States Patent
Su et al.

(10) Patent No.: US 9,361,423 B2
(45) **Date of Patent: *Jun. 7, 2016**

(54) RC CORNER SOLUTIONS FOR DOUBLE PATTERNING TECHNOLOGY

(71) Applicant: Taiwan Semiconductor Manufacturing Company, Ltd., Hsin-Chu (TW)

(72) Inventors: Ke-Ying Su, Taipei (TW); Hsiao-Shu Chao, Baoshan Township (TW); Yi-Kan Cheng, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/289,782

(22) Filed: May 29, 2014

(65) Prior Publication Data

US 2014/0304670 A1 Oct. 9, 2014

Related U.S. Application Data

(63) Continuation-in-part of application No. 13/479,076, filed on May 23, 2012, now Pat. No. 8,751,975.

(60) Provisional application No. 61/623,939, filed on Apr. 13, 2012.

(51) Int. Cl.
*G06F 17/50* (2006.01)

(52) U.S. Cl.
CPC ........ *G06F 17/5081* (2013.01); *G06F 17/5068* (2013.01)

(58) Field of Classification Search
CPC ......................... G06F 17/5081; G06F 17/5068
USPC .................................... 716/50–56; 430/5, 30
See application file for complete search history.

(56) References Cited

U.S. PATENT DOCUMENTS 6,880,138 B1 * 4/2005 Teig et al. ..................... 716/115
7,475,377 B2 1/2009 Yamada (Continued)

FOREIGN PATENT DOCUMENTS

JP 2006209702 8/2006
JP 2008195365 8/2008

OTHER PUBLICATIONS

"Assessing Chip-Level Impact of Double Patterning Lithograohy", by Kwangok Jeong, Andrew B. Kahng, and Ransit O. Topaloglu, IEE @2010.*

(Continued)

*Primary Examiner* — Nha Nguyen
(74) *Attorney, Agent, or Firm* — Slater Matsil, LLP

(57) ABSTRACT

A method includes selecting a process corner, determining model parameters for forming an integrated circuit, and generating a file using the model parameters for the process corner. The generating the file is performed using a computer. The file includes at least two of a first capacitance table, a second capacitance table, and a third capacitance table. The first capacitance table stores greatest parasitic capacitances between layout patterns of the integrated circuit when lithography masks including the layout patterns shift relative to each other. The second capacitance table stores smallest parasitic capacitances between the layout patterns when the lithography masks shift relative to each other. The third capacitance table stores nominal parasitic capacitances between the layout patterns when the lithography masks do not shift relative to each other.

20 Claims, 30 Drawing Sheets

106
30 Model and RC extraction tool; using Metal thickness, bias variations, dielectric layer thickness, and dielectric constant to calculate k_nominal, k_worst, k_best
32 calculating C_nominal, C_worst, and C_best tables for different geometry structure dimensions
34 3-in-1 RC techfile: C_best, C_nominal, C_worst
60 RC extraction tool
36 Analyze and partition polygons in the layout of the circuit
38 Matching nets of the polygons with geometry structures in the RC techfile
40 For matched Nets of polygons, retrieve a C_nominal, a C_worst, and a C_best from the RC techfile
42 Read mask designator (color)
44 If two nets are on the came mark, then use C_nominal as C_worst and C_best
46 Add the parasitic capacitance values of nets into RC netlists
72 Use the RC netlist for performance simulation
74 Compared with Golden values
76 Acceptable ?
No / Yes
78 Adjust k_worst, k_best values
80 Finalized RC techfile

(56) References Cited

U.S. PATENT DOCUMENTS

| | | | |
|---|---|---|---|
| 8,448,120 | B2 | 5/2013 | Huang et al. |
| 2012/0052422 | A1 | 3/2012 | Lu et al. |
| 2012/0054696 | A1 | 3/2012 | Su et al. |

OTHER PUBLICATIONS

Jeong, Kwangok et al., "Assessing Chip-Level Impact of Double Patterning Lithography," IEEE 11th International Symposiun on Quality Electronic Design, Mar. 22-24, 2010, 9 pages.

* cited by examiner

| | S1 | S2 | S3 | S4 |
|---|---|---|---|---|
| W1 | k11_worst | k12_worst | k13_worst | k14_worst |
| W2 | k21_worst | k22_worst | k23_worst | k24_worst |
| W3 | k31_worst | k32_worst | k33_worst | k34_worst |

Fig. 3A

| | S1 | S2 | S3 | S4 |
|---|---|---|---|---|
| W1 | k11_best | k12_best | k13_best | k14_best |
| W2 | k21_best | k22_best | k23_best | k24_best |
| W3 | k31_best | k32_best | k33_best | k34_best |

Fig. 3B

| | S1' | S2' | S3' | S4' | S5' |
|---|---|---|---|---|---|
| W1' | C11_worst | C12_worst | C13_worst | C14_worst | C15_worst |
| W2' | C21_worst | C22_worst | C23_worst | C24_worst | C25_worst |
| W3' | C31_worst | C32_worst | C33_worst | C34_worst | C35_worst |
| W4' | C41_worst | C42_worst | C43_worst | C44_worst | C45_worst |

Fig. 4A

| | S1' | S2' | S3' | S4' | S5' |
|---|---|---|---|---|---|
| W1' | C11_best | C12_best | C13_best | C14_best | C15_best |
| W2' | C21_best | C22_best | C23_best | C24_best | C25_best |
| W3' | C31_best | C32_best | C33_best | C34_best | C35_best |
| W4' | C41_best | C42_best | C43_best | C44_best | C45_best |

Fig. 4B

| | S1' | S2' | S3' | S4' | S5' |
|---|---|---|---|---|---|
| W1' | C11_nominal | C12_nominal | C13_nominal | C14_nominal | C15_nominal |
| W2' | C21_nominal | C22_nominal | C23_nominal | C24_nominal | C25_nominal |
| W3' | C31_nominal | C32_nominal | C33_nominal | C34_nominal | C35_nominal |
| W4' | C41_nominal | C42_nominal | C43_nominal | C44_nominal | C45_nominal |

| | Net | C_worst | | C_best | | C_nominal |
|---|---|---|---|---|---|---|
| 1 | Net1 | 0.012 | : | 0.01 | : | 0.08 |
| 2 | Net2 | 0.032 | : | 0.032 | : | 0.032 |
| 3 | Net3 | 0.014 | : | 0.012 | : | 0.001 |

| | Net | Cap |
|---|---|---|
| 1 | Net1 | 0.012 |
| 2 | Net2 | 0.032 |
| 3 | Net3 | 0.014 |

| | S1- | S2- | S3- | S4- |
|---|---|---|---|---|
| W1+ | k11_worst | k12_worst | k13_worst | k14_worst |
| W2+ | k21_worst | k22_worst | k23_worst | k24_worst |
| W3+ | k31_worst | k32_worst | k33_worst | k34_worst |

k_worst values at Typical process corner

Fig. 14A

| | S1+ | S2+ | S3+ | S4+ |
|---|---|---|---|---|
| W1- | k11_best | k12_best | k13_best | k14_best |
| W2- | k21_best | k22_best | k23_best | k24_best |
| W3- | k31_best | k32_best | k33_best | k34_best |

k_best values at Typical process corner

Fig. 14B

| | S1' | S2' | S3' | S4' | S5' |
|---|---|---|---|---|---|
| W1' | C11_nominal | C12_nominal | C13_nominal | C14_nominal | C15_nominal |
| W2' | C21_nominal | C22_nominal | C23_nominal | C24_nominal | C25_nominal |
| W3' | C31_nominal | C32_nominal | C33_nominal | C34_nominal | C35_nominal |
| W4' | C41_nominal | C42_nominal | C43_nominal | C44_nominal | C45_nominal |

C_nominal values at Typical process corner

Fig. 15A

| | S1'- | S2'- | S3'- | S4'- | S5'- |
|---|---|---|---|---|---|
| W1'+ | C11_worst | C12_worst | C13_worst | C14_worst | C15_worst |
| W2'+ | C21_worst | C22_worst | C23_worst | C24_worst | C25_worst |
| W3'+ | C31_worst | C32_worst | C33_worst | C34_worst | C35_worst |
| W4'+ | C41_worst | C42_worst | C43_worst | C44_worst | C45_worst |

C_worst values at Typical process corner

Fig. 15B

| | S1'+ | S2'+ | S3'+ | S4'+ | S5'+ |
|---|---|---|---|---|---|
| W1'- | C11_best | C12_best | C13_best | C14_best | C15_best |
| W2'- | C21_best | C22_best | C23_best | C24_best | C25_best |
| W3'- | C31_best | C32_best | C33_best | C34_best | C35_best |
| W4'- | C41_best | C42_best | C43_best | C44_best | C45_best |

C_best values at Typical process corner

Fig. 15C

| | S1- | S2- | S3- | S4- |
|---|---|---|---|---|
| W1+ | k11_worst | k12_worst | k13_worst | k14_worst |
| W2+ | k21_worst | k22_worst | k23_worst | k24_worst |
| W3+ | k31_worst | k32_worst | k33_worst | k34_worst |

k_worst values at Cworst global process corner

Fig. 16A

| | S1+ | S2+ | S3+ | S4+ |
|---|---|---|---|---|
| W1- | k11_best | k12_best | k13_best | k14_best |
| W2- | k21_best | k22_best | k23_best | k24_best |
| W3- | k31_best | k32_best | k33_best | k34_best |

k_best values at Cworst global process corner

Fig. 16B

| | S1' | S2' | S3' | S4' | S5' |
|---|---|---|---|---|---|
| W1' | C11_nominal | C12_nominal | C13_nominal | C14_nominal | C15_nominal |
| W2' | C21_nominal | C22_nominal | C23_nominal | C24_nominal | C25_nominal |
| W3' | C31_nominal | C32_nominal | C33_nominal | C34_nominal | C35_nominal |
| W4' | C41_nominal | C42_nominal | C43_nominal | C44_nominal | C45_nominal |

C_nominal values at Cworst global process corner

Fig. 17A

| | S1'- | S2'- | S3'- | S4'- | S5'- |
|---|---|---|---|---|---|
| W1'+ | C11_worst | C12_worst | C13_worst | C14_worst | C15_worst |
| W2'+ | C21_worst | C22_worst | C23_worst | C24_worst | C25_worst |
| W3'+ | C31_worst | C32_worst | C33_worst | C34_worst | C35_worst |
| W4'+ | C41_worst | C42_worst | C43_worst | C44_worst | C45_worst |

C_worst values at Cworst global process corner

Fig. 17B

|  | S1'+ | S2'+ | S3'+ | S4'+ | S5'+ |
|---|---|---|---|---|---|
| W1'- | C11_best | C12_best | C13_best | C14_best | C15_best |
| W2'- | C21_best | C22_best | C23_best | C24_best | C25_best |
| W3'- | C31_best | C32_best | C33_best | C34_best | C35_best |
| W4'- | C41_best | C42_best | C43_best | C44_best | C45_best |

C_best values at Cbest global process corner

Fig. 17C

RC CORNER SOLUTIONS FOR DOUBLE PATTERNING TECHNOLOGY

PRIORITY CLAIM

This application is a continuation-in-part application of the following commonly-assigned U.S. patent application Ser. No. 13/479,076, filed May 23, 2012, and entitled "RC Corner Solutions for Double Patterning Technology;" which further claims the benefit of U.S. Provisional Patent Application No. 61/623,939, filed on Apr. 13, 2012, and entitled "RC Corner Solutions for Double Patterning Technology," which applications are incorporated herein by reference.

BACKGROUND

Double patterning is a technology developed for lithography to enhance the feature density. Typically, for forming features of integrated circuits on wafers, the lithography technology is used, which involves applying a photo resist, and defining patterns on the photo resist. The patterns in the patterned photo resist are first defined in a lithography mask, which may be a glass with transparent patterns and opaque portions formed thereon. The transparent patterns of the lithography mask allow the light for exposing the photo resist to pass, and the opaque patterns blocks the light. The patterns in the patterned photo resist are then transferred to the manufactured features.

With the increasing down-scaling of integrated circuits, the optical proximity effect posts an increasingly greater problem. When two separate features are too close to each other, the optical proximity effect may cause the features to short to each other. To solve such a problem, double patterning technology is introduced. The closely located features are separated to two masks of a same double-patterning mask set, with both masks used to expose the same photo resist. In each of the masks, the distances between features are increased over the distances between features in the otherwise a single mask, and hence the optical proximity effect is reduced, or substantially eliminated.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A and 3B illustrate a k_worst and a k_best table, respectively, in accordance with some embodiments;

FIGS. 4A, 4B, and 4C illustrate a C_worst, a C_best, and a C_nominal table, respectively, in accordance with some embodiments;

FIG. 6 illustrates a portion of a RC netlist file generated using the process flow in FIG. 5 in accordance with some embodiments;

FIG. 10 illustrates a portion of a RC netlist file generated using the process flow in FIG. 8 in accordance with some embodiments;

FIGS. 14A and 14B illustrate a k_worst table and a k_best table, respectively, at the typical process corner in accordance with some embodiments;

FIGS. 15A, 15B, and 15C illustrate a C_worst table, a C_best table, and a C_nominal table, respectively, at the typical process corner in accordance with some embodiments;

FIGS. 16A and 16B illustrate a k_worst table and a k_best table, respectively, at the Cworst global process corner in accordance with some embodiments; and FIGS. 17A, 17B, and 17C illustrate a C_worst table, a C_best table, and a C_nominal table, respectively, at the Cworst global process corner in accordance with some embodiments.

DETAILED DESCRIPTION

Figure 1:
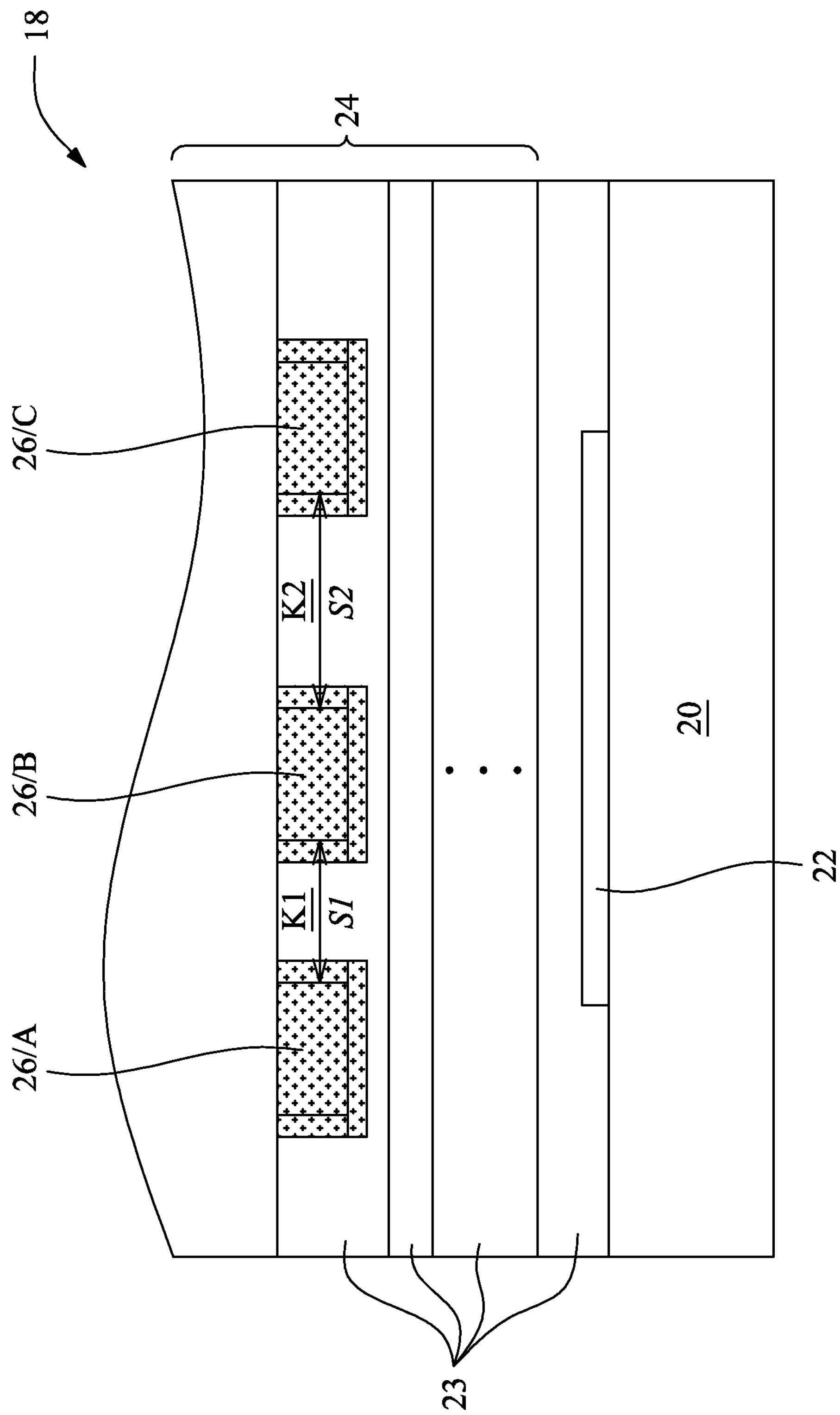
FIG. 1 illustrates a cross sectional view of a semiconductor chip, which is formed using double patterning technology.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of determining parasitic capacitances and generating netlists for different process corners is provided in accordance with various exemplary embodiments. The variations of the embodiments are discussed. Throughout the various views and illustrative embodiments, like reference numbers are used to designate like elements. Throughout the description, although metal lines are used as examples to describe the concept of the embodiments, the embodiments may be applied on all conductive features such as polysilicon features in integrated circuits.

FIG. 1 schematically illustrates semiconductor chip 18. Chip 18 includes substrate 20, which may be a semiconductor substrate such as a silicon substrate. Integrated circuit 22 is formed at a surface of substrate 20, wherein integrated circuit 22 includes transistors, resistors, capacitors, inductors, or the like. Interconnect structure 24 is formed over, and electrically coupled to, integrated circuit 22. Interconnect structure 24 includes a plurality of dielectric layers 23, and metal lines 26 and vias (not shown) in the dielectric layers 23.

In the illustrated example, metal lines 26, which are also marked as A, B, and C to distinguish from each other, have parasitic capacitance formed with each other. Assuming that the patterns of metal lines A and C are in a first lithography mask of a double patterning mask set, and the patter of metal line B is in a second lithography mask of the double patterning mask set, when the second lithography mask shifts to left relative to the first lithography mask, the distances S1 reduces, and distance S2 increases. The reduction in distance S1 results in the increase in the parasitic capacitance between metal lines A and B, and the increase in distance S2 results in the reduction in the parasitic capacitance between metal lines B and C. In some embodiments, the change due to the shift of lithograph masks is treated as the change caused by the dielectric constant (k value) of the dielectric material between metal lines A and B and between metal lines B and C, although the k value of the dielectric materials in some embodiments does not change when the second lithography mask shifts relative to the first lithography mask. Furthermore, in accordance with some embodiments, when k values are assumed to be changed for example, with k1 greater than k2, it is assumed that the corresponding spacings S1 and S2 between metal lines A, B and C remain unchanged, and are equal to the designed values. Alternatively stated, in accordance embodiments, equivalent k-value changes are used to represent the effect caused by the shift of lithography masks, and with the equivalent k-value changes, it is assumed that the lithography masks do not shift.

When the lithography masks shift, the parasitic capacitance of a metal line with all other metal features may increase or decrease, depending the direction of the shift, the magnitude of the shift, and various other factors. In some embodiments, the maximum shift that may occur to a specific circuit manufacturing can be determined, for example, according to the previous manufacturing experience. Within the limit of the maximum magnitude of the mask shift, the lithography mask shift may have any magnitude and in any direction. The parasitic capacitance also changes in response to the mask shift. When the magnitudes and the directions of the mask shift change, a metal line (such as metal line B) will have a biggest parasitic capacitance value with other conductive feature, which capacitance is also referred to the worst capacitance (C_worst) throughout the description. There will also be a smallest capacitance value, which is referred to the best capacitance (C_best). The C_best value is smaller than the C_worst value. Furthermore, there is also a nominal parasitic capacitance (C_nominal) for each of the metal lines in a circuit, which is the parasitic capacitance when there is no mask shift occurs. Accordingly, there exists the relationship C_best<=C_nominal<=C_worst. Throughout the description, each of the C_worst, C_best, and C_nominal is referred to as corresponding to a process corner, namely, the worst, the best, and the nominal process corners.

Figure 2:
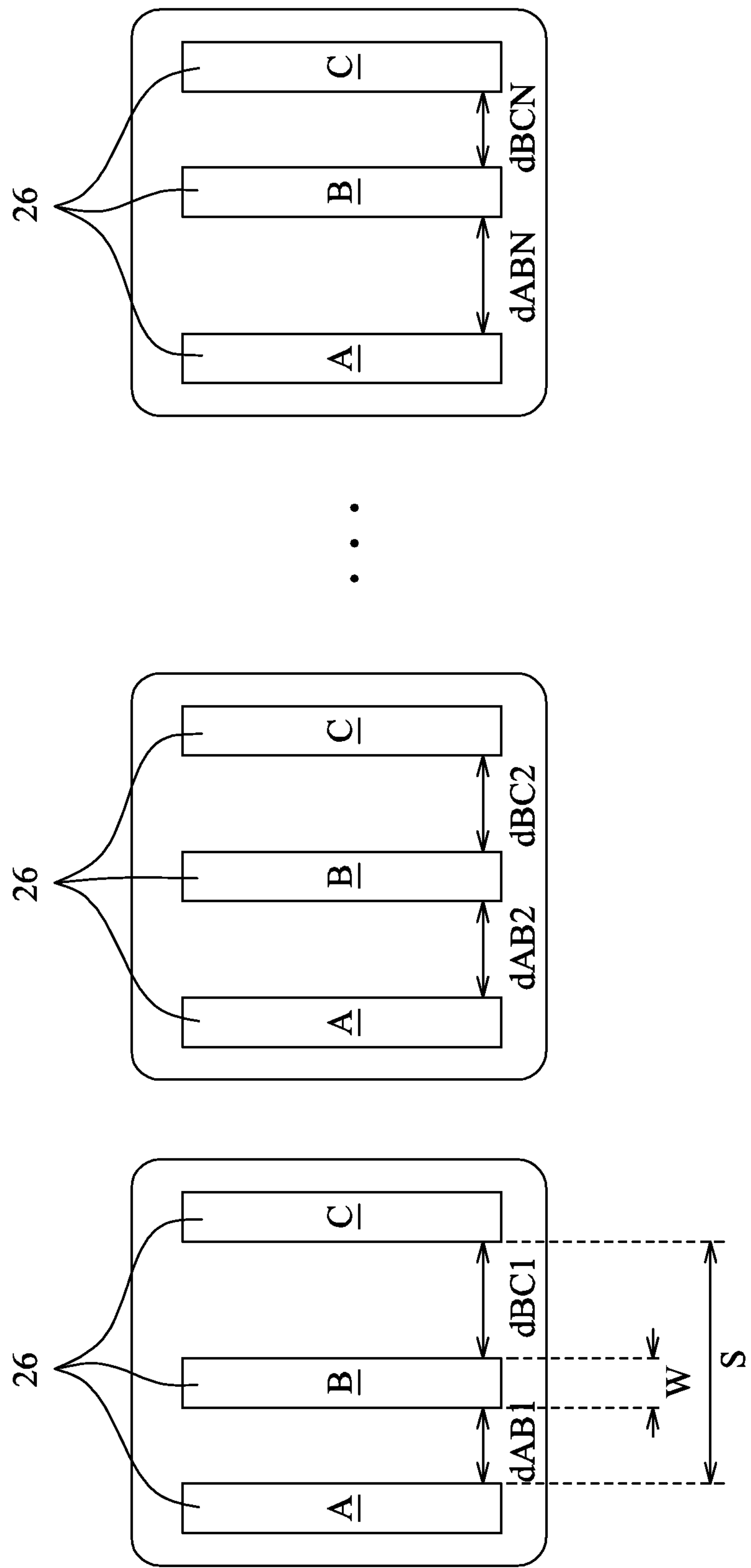
FIG. 2 illustrates metal lines have different spacings, wherein a simulation is performed to calculate a worst capacitance value and a best capacitance value in accordance with some embodiments.

FIG. 2 illustrates how capacitance values C_worst and C_best are calculated through simulation. The simulated metal lines 26 include A, B, and C, which are parallel to each other. Metal line B is between metal lines A and C. Metal lines A and C are on a first lithography mask, and metal line B is on a second lithography mask, wherein the first and the second lithography masks form a double patterning mask set. The first and the second lithography masks include opaque patterns for blocking light, and transparent patterns for allowing the light to pass through. The distance S between metal lines A and C remains constant due to the fact that metal lines A and C are on the same mask. Metal line B shifts relative to metal lines A and C due to the mask shift. The direction and the magnitude of the shift affect the distance between metal lines A and B and between metal lines B and C, and the change in the direction and the magnitude of the shift results in the change in the parasitic capacitance between metal lines A and B and the parasitic capacitance between metal lines B and C.

FIG. 2 illustrates a plurality of simulation samples, wherein the magnitudes and the directions of different samples are different from each other. The distances dAB (including dAB1, dAB2 . . . dABN) are different from each other, and distances dBC (including dBC1, dBC2 . . . dBCN) are different from each other. Distances dAB and dBC are selected so that the magnitude of the shift is smaller than or equal to the maximum magnitude, which is pre-determined, for example, from manufacturing experiences. For each of the samples, the total parasitic capacitance of metal line B, which is the sum of the parasitic capacitance between metal lines A and B and the parasitic capacitance between metal lines B and C, is calculated. The worst capacitance C_worst and best capacitance C_best are found from the plurality of coupling parasitic capacitance of metal line B. The C_worst value is the greatest coupling parasitic capacitance of metal line B in all samples, and the C_best value is the smallest coupling parasitic capacitance of metal line B in all samples.

As aforementioned, the change in the parasitic capacitance due to the change in spacing between metal lines corresponds to a change in the k value of the dielectric material between the metal lines when holding the spacing unchanged. Accordingly, C_worst and C_best are converted to a worst k_value (k_worst) and a best k value (k_best), respectively. The conversion may be performed using equation:

$$k=(CS)/(\in oA) \qquad \text{[Eq. 1]}$$

wherein k is the dielectric constant, C is the capacitance (C_worst or C_best), S is the spacing between metal lines, and ∈o is the electric constant of the dielectric material between the metal lines, and A is the overlap area between the metal lines.

Both the spacing (such as dAB or dBC) between a metal line (such as metal line B) and its neighboring metal lines (such as A and C) and the width W of metal line B affect the resulting C_worst and C_best values, and hence affect the equivalent k_worst and k_best values, A plurality of calculations/simulation may be performed for a plurality of metal lines, each having a plurality of spacings, a plurality of widths, and a plurality of thicknesses. In each of the calculations/simulations, a k_worst and a k_best value are obtained. The results are used to form a table for storing k_worst values, which table is referred to as a k_worst table. An exemplary k_worst table is shown in FIG. 3A, wherein the width W (such as W1 through W3) of metal line B is placed as the column index, and the spacing (such as S1 through S4) between metal line B and its neighboring metal lines is placed as the row index. The table cell values are k_worst values. Similarly, a table is formed for best k value k_best, which table is referred to as a k_best table. An exemplary k_best table is shown in FIG. 3B. Furthermore, if there is no shift between the masks in the double patterning mask set, the k value between metal line B and metal line A, and the k value between metal line B and metal line C will be equal to a nominal value k_nominal, which is the k value of the dielectric material that will be used in the manufacturing process.

FIG. 2 illustrates the change of the same-level capacitance (referred to as coupling capacitance hereinafter) in response to the shift of lithograph masks, wherein the same-level capacitance is the capacitance between a metal line and all other metal lines in the same metal layer as the metal line. It is realized that metal lines also have capacitance with the overlying and underlying metal lines (not shown) in additional to the same-level capacitance. Hence, there is a total capacitance between a metal line and all its neighboring metal lines including those at the same level as the metal line and those overlying and underlying the metal line. Since the worst coupling capacitance often occurs when the worst total capacitance occurs, and the best coupling capacitance often occurs when the best total capacitance occurs, the coupling capacitance is discussed herein without further discussing the total capacitance.

The k_worst table and the k_best table are then used to establish a C_worst table and a C_worst table, as shown in FIGS. 4A and 4B, respectively. A "'" sign is appended to each of the spacings S1 through S5 and each of the widths W1 through W4 to indicate that they may or may not have a one-to-one correspondence with the column and the row index of the k_worst table and the k_best table. The C_worst table is constructed by using the k_worst values in the k_worst table, and using the following equation as a reference (with additional factors considered):

$$C = \in o k(A/S) \quad \text{[Eq. 2]}$$

wherein k is the dielectric constant (k_worst or k_best, depending on whether C is the C_worst or the C_best) that is found from the k_worst or the k_best table, C is the capacitance C_worst or C_best, S is the spacing, ∈o is the electric constant, and A is the overlap area of the respective metal lines.

In some embodiments, converting C_worst and the C_best values obtained from FIG. 2 to the k_worst and k_best values, and then converting the k_worst and k_best values back to C_worst and the C_best values forms a useful loop. For example, in some embodiments, the total number of simulated patterns such as metals or features 26 (A, B, and C) is limited. When calculating the C_worst and the C_best values from the k_worst and k_best, a greater number of patterns with a count more than the count of the original count of the C_worst and the C_best values for calculating k_best and k_worst value. Accordingly, the C_worst values and C_best values of metal lines with more shapes, more sizes, and so on than the patterns in FIG. 2, may be calculated. For example, FIG. 2 illustrates metals 26 as being metal strips, and through the calculation, the C_worst and the C_best may be calculated for other shapes such as hexagons. Furthermore, other factors that affect the capacitances, such as width W of metal line B, are also be considered so that the calculated C_worst and the C_best include additional considerations.

FIG. 4C further illustrates a C_nominal table, wherein the nominal parasitic capacitances between metal lines are calculated using equation 2 as a reference, and the k value in Equation 2 is k_nominal.

It is appreciated that although FIGS. 3A through 4C use tables to store the width W, the spacing S, the capacitance values, and the k values, the storage and the indexing of these value are not limited to tables. For example, a database may be constructed so that the contents in FIGS. 3A through 4C may be stored and indexed into.

Tables 4A, 4B, and 4C are referred to as a three-in-one capacitance table, and the content in tables 4A, 4B, and 4C may be incorporated into a computer file, which is denoted as a techfile (which may include a plurality of techfiles). The techfile may have any format including tables, lists, or the like. In the techfile, each net, which is a piece of conductive feature such as a piece of metal line, is associated with three capacitance values, namely C_worst, C_best, and C_nominal. The respective techfile is accordingly referred to as a three-in-one techfile. Since different metal layers may have different metal thicknesses, a three-in-one capacitance table and a three-in-one techfile may be formed for each of the metal layers. The three-in-one techfile may then be used to construct netlists for designed integrated circuits.

Figure 5:
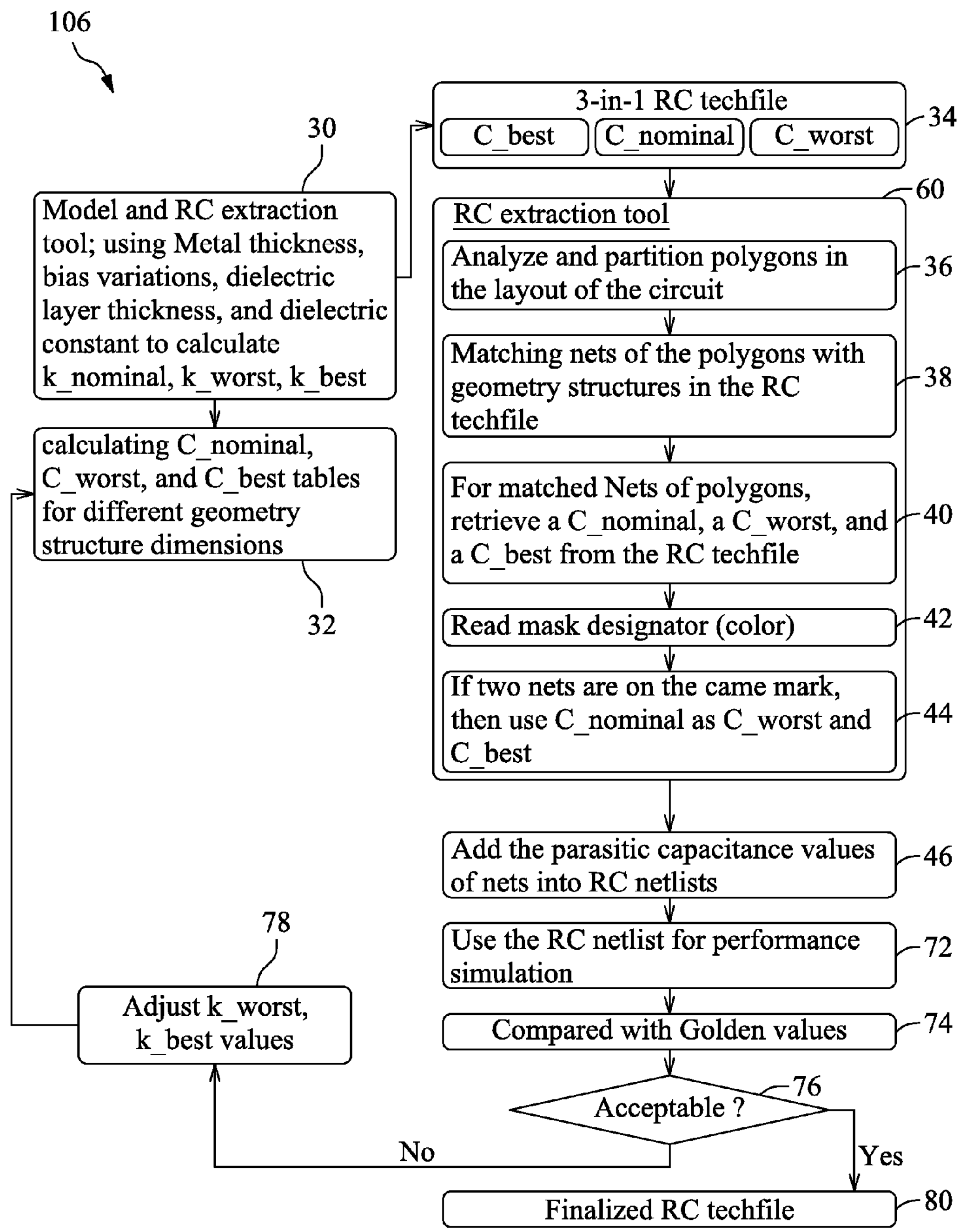
FIG. 5 illustrates a flow chart of generating RC netlists for a circuit design in accordance with some embodiments.

FIG. 5 illustrates a flow chart of process 106 for constructing netlists for an integrated circuit design. Referring to step 30. A model and a respective RC extraction tool are selected. Along with the model, the technology node that is used to form the integrated circuit is determined. Furthermore, the process parameters associated with the model and the forming technology is determined, which process parameters include metal thicknesses (for example, in FIG. 1), bias variations, dielectric layer thicknesses for each of the dielectric layers, nominal dielectric constant k_nominal for each of the dielectric layers, etc. Based on these values, the k_worst and the k_best tables (FIGS. 3A and 3B) are also calculated using the method related to FIG. 2, which include calculating the C_best and C_worst values by shifting mask with different shifting distances as shown FIG. 2, and then converting the C_best and C_worst values to the K_worst values and k_best values. Next, in step 32, C_nominal values, C_best values, and C_worst values are calculated, and the three-in-one techfile (which may be the three-in-one capacitance table that includes the C_worst table, the C_best table, and the C_nominal table) is constructed, wherein the three-in-one techfile is illustrated in block 34 (FIGS. 4A through 4C). The construction of the three-in-one techfile includes changing the geometry dimensions, which affect the sizes of metal lines, the overlap area of the neighboring metal lines, etc., which affect the capacitance values, and calculating the C_worst values, the C_best values, and the C_nominal values. The construction of the three-in-one techfile also includes changing the process materials such as the dielectric material between metal lines, wherein the process materials also affect the C_worst values, the C_best values, and the C_nominal values.

In FIG. 5, box 60 represents an RC extraction tool that is configured to perform the steps 36, 38, 40, 42, and 44. The respective steps in combination are also included in the steps for designing the integrated circuit. The RC extraction tool 60 may be a software running on a computer.

The design of an integrated circuit is provided, and the layout is extracted (step 36) by analyzing the polygons of the features (such as metal features) in the layout. In some embodiments, the polygons in the layout may be partitioned into smaller pieces, with each of the pieces referred to a net throughout the description. For example, a long metal line may be partitioned into a plurality of short metal lines, which are nets. In step 38, the nets of polygons are used to match the geometry structures in the RC techfiles. Referring to step 38, each of the nets is matched to or interpolated from the stored items the three-in-one techfile, for example, by using the geometry structure (such as the width of a net and the spacing of the two neighboring nets on the opposite sides of the net as indexes to index to the C_worst, C_best, and C_nominal tables. For example, the thickness of the net, the width W of the net, and the spacing between the net and the neighboring features are used as the row index or column index. As a result, for each of the nets, three capacitance values C_worst, C_best, and C_nominal are retrieved, and a netlist for the net is generated to store the retrieved C_worst, C_best, and C_nominal values. By traversing through the partitioned nets of a polygon, the netlists of the entire polygon are obtained. Furthermore, by traversing through the polygons of the entire layout of the integrated circuit, the netlists of the entire layout may be obtained, and written as the netlists of the integrated circuit.

Figure 7A:
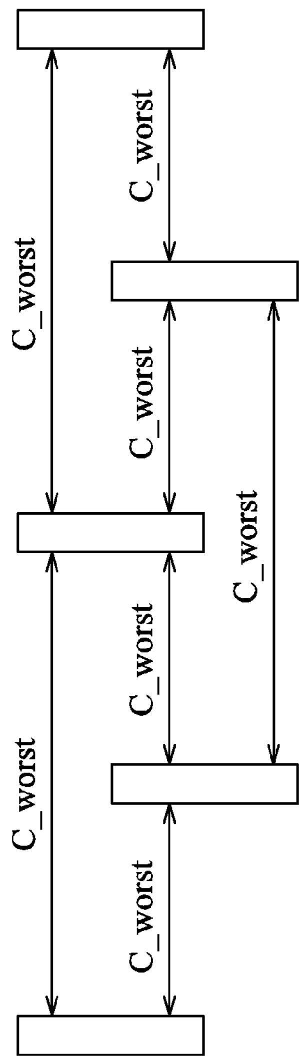
FIG. 7A illustrates the parasitic capacitance values to be retrieved for the worst process corner when no mask designators are applied on nets in accordance with some embodiments.

In some embodiments, when two nets are assigned to a same lithography mask of a double patterning mask set, the distance there between remains the same regardless how the masks in the double patterning mask set shift relative to each other. Accordingly, the spacing between these two nets is the same as designed, and the parasitic capacitance between them is the nominal capacitance C_nominal. Accordingly, for all the nets on the same lithography mask, their capacitance formed there between should be found from the C_nominal table (and/or the respective portion of the three-in-one techfile). In the respective netlists for these nets, the respective C_worst and C_best therebetween are also equal to the respective C_nominal. FIG. 7A illustrates a portion of an exemplary layout. In the example shown in FIG. 7A, the illustrated rectangular patterns are the patterns of nets. It has not been determined how to assign the illustrated nets to masks. Accordingly, there is no guarantee that two nets will be assigned to the same mask. It is thus assumed that each of the illustrated nets is on a different mask than other illustrated nets so that the worst possible and best possible capacitance values of these nets can be retrieved from the three-in-one techfile. When writing into a netlist, the C_worst values of the illustrated nets will be retrieved from the C_worst table since when two nets are on different masks, these two nets can shift relative to each other when their respective masks shift relative to each other, and hence their capacitance can potentially be the worst capacitance. The concept is illustrated with more detail in FIG. 7B.

Figure 7B:
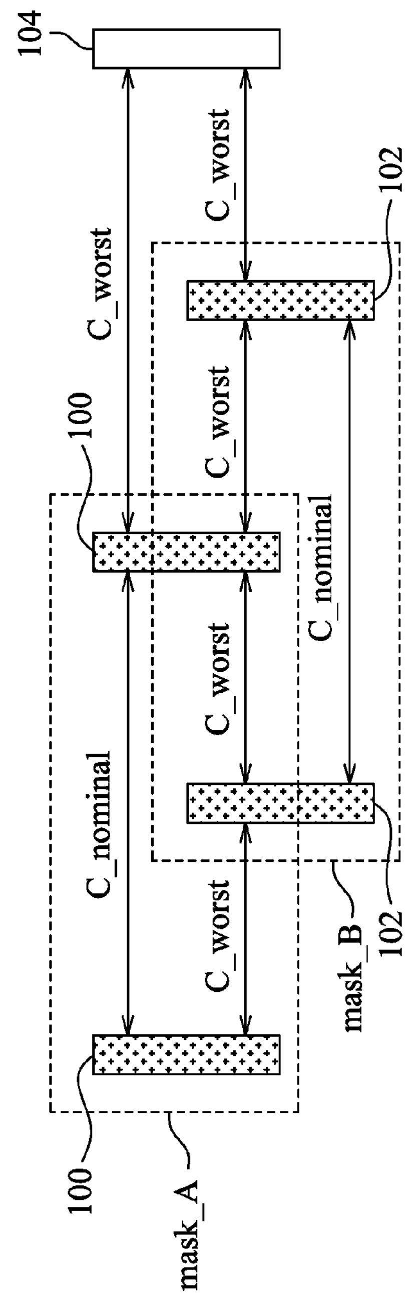
FIG. 7B illustrates the parasitic capacitance values to be retrieved for the worst process corner when mask designators are applied on nets, wherein the capacitance between the nets on the same mask are retrieved from the C_nominal table in accordance with some embodiments.

Referring to FIG. 7B, the nets as shown in FIG. 7A are decomposed (assigned) into two masks, wherein nets 100 are in mask_A, and nets 102 are in mask_B. Further, it has not been determined which mask net 104 is to be assigned to. At the layout design stage (before step 36), nets 100 and 102 are marked with a first color and a second color, respectively, indicating that they are placed on masks mask_A and mask_B, respectively. Net 104 is not colored, indicating that it has not been assigned with a mask. In accordance with some embodiments, the colors (mask designators) of the nets are read from the layout of integrated circuit, and are used to determine whether the respective C_worst and C_best values should be replaced with C_nominal values. For example, nets 100 are in the same mask_A, and hence they will not shift relative to each other. Accordingly, their capacitance values will be replaced by nominal capacitance values. The colors are also referred to as mask designators, which designate the corresponding masks that are associated with nets. It is appreciated that other mask designators such as numbers, letters, or the like, may also be used as mask designators.

Referring back to FIG. 5, in step 42, the mask designators (colors) of the nets are read from the layout of the integrated circuit, wherein the mask designators designate the mask the respective net should be on. Accordingly, it can be determined whether two nets are on the same mask or not. The capacitance values of the nets, which were originally assumed to be C_worst values, will be replaced with C_nominal values if the two nets are on the same mask. For example, nets 100 in FIG. 7B have the same color, nets 102 have the same color, and net 104 is uncolored. Since the colors indicate that nets 100 have the same color, the C_worst and C_best values between nets 100 are replaced with the C_nominal value (step 44), the C_worst and C_best values between nets 102 are replaced with the C_nominal value (step 44), while the C_worst and C_best values between a metal line 100 and a net 102 remain unchanged. FIG. 6 illustrates a file comprising a portion of the resulting netlists. Net2 represents one of the respective nets, wherein the C_worst and C_best values of Net2 are equal to the respective C_nominal having a value 0.032. The un-colored net 104 is treated as being placed on different masks than both mask_A and mask_B. Accordingly, the C_worst and C_best values between net 104 and nets 100 remain un-replaced because they are assumed to be on different masks (with net 104 not being assigned with a mask, and net 100 being in mask mask_A). The C_worst and C_best values between net 104 and nets 102 remain un-replaced because they are assumed to be on different masks (with net 104 not being assigned with a mask, and net 102 being in mask mask_B).

The constructed capacitance values, which include the C_worst, C_best, and C_nominal values, are then added into netlists (step 46 in FIG. 5). An exemplary netlist is represented as Net1, Net2, or Net3 in FIG. 6. The values in FIG. 6 are exemplary C_worst, C_best, and C_nominal values.

FIG. 6 illustrates a portion of an exemplary netlist file 49, which includes the netlists for nets Net1, Net2, Net3, and so on. Each of the nets is associated with a C_worst, a C_best, and a C_nominal value. For example, the net Net1 has the C_worst, C_best, and C_nominal capacitance values of 0.012, 0.01, 0.08, respectively, wherein the units of the capacitance may be pico-farad or any units. The C_worst and C_best capacitance values of each of Net1, Net2, and Net3 are obtained using the steps 30 through 46 in FIG. 5. The C_nominal capacitance values of each of Net1, Net 2, and Net3 are calculated using equation 2 assuming no mask shift occurs. Accordingly, designers may take these values, and run performance simulations for the integrate circuit.

Since the C_worst, the C_best, and the C_nominal values are provided, the best performance (such as the best timing), the worst performance, and the nominal performance, which are associated with C_worst values, C_best values, and C_nominal values, respectively, may be simulated using the netlists. Referring to step 72, the RC netlist as constructed in step 46 are used to simulate the performance of circuits. For example, the performance of the circuits may include the timing (such as the setup time and/or the hold time) of some digital circuits. The performance of circuits may also include other key performance index such as the frequency of some analog circuits, which are also affected by the capacitance and the RC values in the netlists.

Next, in step 74, golden values of the performance of the respective circuits simulated in step 72 are obtained. The golden values reflect the actual values that are very likely to occur in real circuits. In some embodiments, the golden values are obtained by forming sample semiconductor chips including the circuits that are simulated in step 72, and then measuring the performance values from the sample semiconductor chips. In alternative embodiments, the golden values are obtained by simulating the circuits using simulation softwares. The golden values also include worst performance values, best performance values, and nominal performance values.

Generally, the k_worst and the C_worst values as shown in FIGS. 3A-4C and steps 46 and 72 in FIG. 5 are obtained by considering various types of worst values such as the worst thickness, the worst line width W, the worst spacing S, etc. In some embodiments, it seldom happens that all these types of worst values occur at the same time. Accordingly, the worst performance values in the golden values most likely will not be the worst performance values obtained in step 72. Similarly, the k_best and the C_best values as shown in FIGS. 3A-4C and steps 46 and 72 in FIG. 5 are obtained by considering various types of best values such as the best thickness, the best line width W, the best spacing S, etc. In some embodiments, it seldom happens that all these types of best values occur at the same time. Accordingly, the best performance values in the golden values most likely will not be the best performance values obtained in step 72. In step 76, the worst performance values obtained in step 72 is compared to the worst performance values in the golden values, and the best performance values obtained in step 72 is compared to the best performance values in the golden values.

If the difference between the worst performance values obtained in step 72 and the worst performance values in the golden values is smaller than a pre-determined threshold value (such as a predetermined percentage such as 5 percent, 10 percent, etc.), and the difference between the best performance values obtained in step 72 and the best performance values in the golden values is smaller than a pre-determined threshold value (such as the percentage), then the 3-in-1 techfile (step 34) and the RC netlist (step 46) are determined as acceptable (step 76). The process flow goes to step 80, wherein the RC techfile and the RC netlist are final.

Conversely, if the difference between the worst performance values obtained in step 72 and the worst performance values in the golden values is greater than the pre-determined threshold value, it indicates that the k_worst values and the C_worst values should be adjusted (step 76). Similarly, if the difference between the best performance values obtained in step 72 and the best performance values in the golden values is greater than the pre-determined threshold value, it indicated that the k_best values and the C_best values obtained in steps 30 and 32 should be adjusted (step 76). Accordingly, as shown in step 78, k_worst values and/or k_best values are adjusted. C_worst values and/or C_best values are also adjusted. The magnitude of the adjustment is estimated to try to make the simulation results (step 72) to be the same or close to the golden results (step 74). Next, steps 32 and 34 are performed to re-construct the 3-in-1 techfile, with the adjusted k_best and the k_worst values adjusted in step 78 used in the re-construction. Steps 36 through 76 are then performed again. The above-discussed iteration in FIG. 5 is performed until in step 76, the 3-in-1 techfile (step 34) and the RC netlist (step 46) are determined as acceptable, and the RC netlist is finalized.

The process flow in FIG. 5 may be used when the respective simulator for simulating the performance of the integrated circuit is configured to recognize the format of more than one capacitance values including C_worst, C_best, and C_nominal values. If the format used by the simulator does not support the multi-valued capacitance values, the flow chart in FIG. 8 may be used. In the netlists constructed using the flow 108 in FIG. 8, each of the nets is related to one, instead of three, of the C_worst, C_best, and C_nominal. Different nets, however, may be obtained from different ones of the C_worst, C_best, and C_nominal tables.

Figure 8:
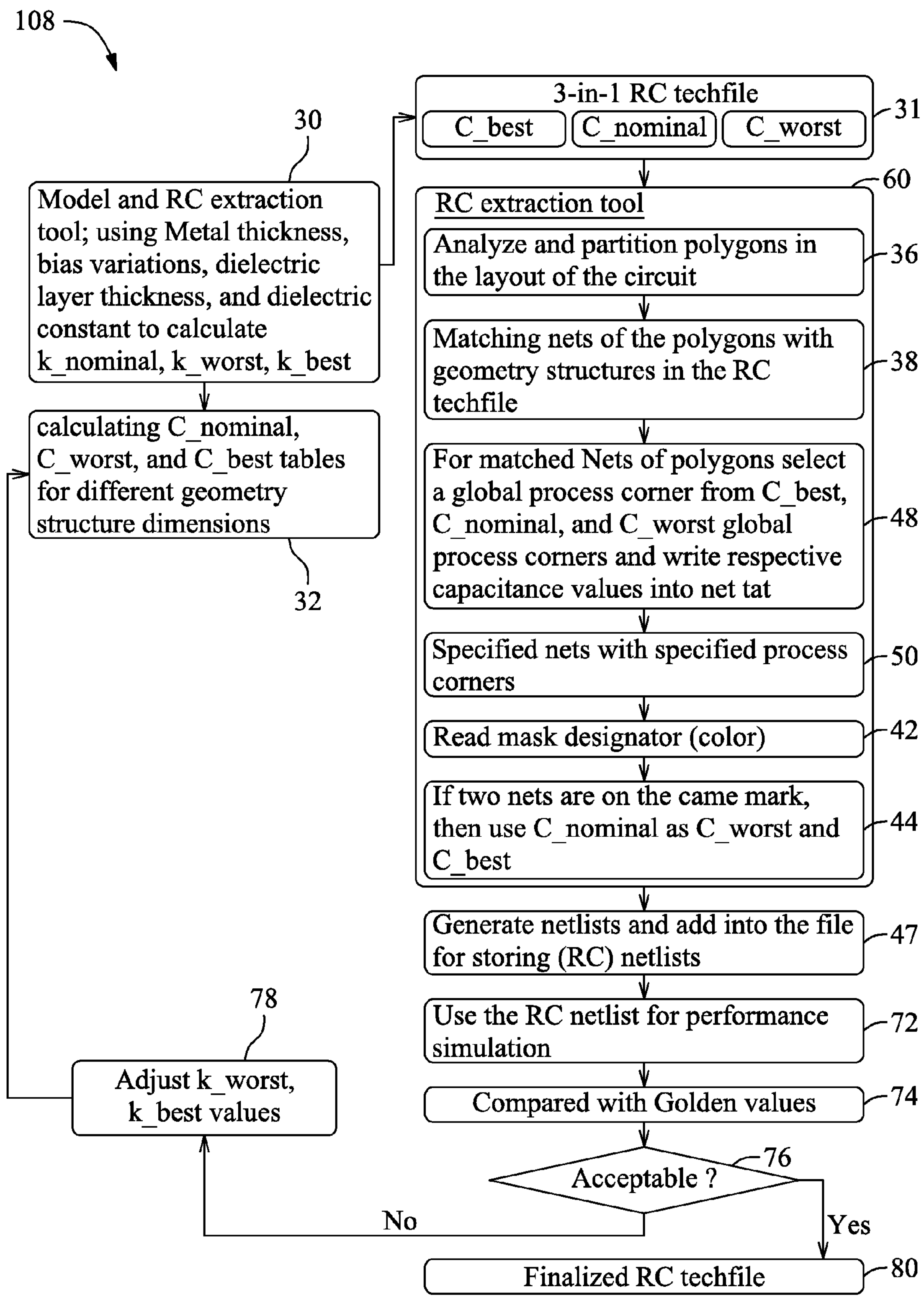
FIG. 8 illustrates a flow chart of generating RC netlists for a circuit design in accordance with alternative embodiments.

In FIG. 8, steps 30, 32, 34, 36, and 38 are the same as shown in FIG. 5, and the respective details are not repeated herein. In step 48, a global process corner is selected, which is the default process corner for all nets in the layout. Throughout a description, a global process corner is also referred to as a process corner. The global process corners represent the maximum variations of fabrication parameters in the fabrication of wafers when the circuits on wafers still function correctly. In the following discussion, it is assumed that the selected global process corner is the nominal corner. Accordingly, in the step shown in box 48, C_nominal values are retrieved from the three-in-one techfile for all nets in the layout and are by default written into the netlists as an example. Next, in step 50, some of the designated nets may be changed from the selected global process corner (selected in step 48) to other process corners. For example, a file may be provided, in which the desirable process corners of some selected nets are specified.

Figure 9:
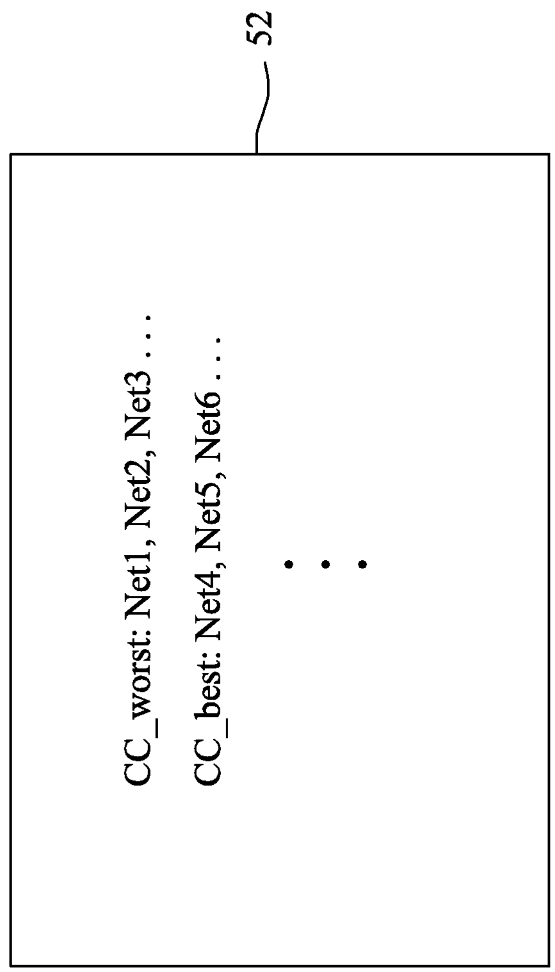
FIG. 9 illustrates an exemplary file used for specifying process corners for selected nets in the layout in accordance with some embodiments.

FIG. 9 schematically illustrates file 52, which is stored on a tangible non-transitory storage medium such as a hard disk. File 52 specifies that nets Net1, Net2, and Net3 should be at the worst process corner, and nets Net4, Net5, and Net6 should be at the best process corner. Accordingly, in step 50 in FIG. 8, when nets Net1, Net2, and Net3 are processed, the capacitance values of nets Net1, Net2, and Net3 are changed to the respective C_worst values retrieved from the C_worst table in the three-in-one techfile. The retrieved C_worst values replace the default C_nominal values for nets Net1, Net2, and Net3. Similarly, the capacitance values of nets Net4, Net5, and Net6 are changed to the respective C_best values retrieved from the C_best table in the three-in-one techfile. The retrieved C_best values replace the default C_nominal values for nets Net4, Net5, and Net6.

Next, in steps 42 and 44 in FIG. 8, the color information are read from the layout, and the capacitances between the nets that have the same color (on the same mask) are changed to the respective C_nominal values, assuming they were not C_nominal values before. The details of steps 42 and 44 are essentially the same as the steps 42 and 44 in FIG. 5. In step 47, netlists are generated, and are added into the file for storing (RC) netlists. FIG. 10 shows an example of the generated exemplary netlists, which are shown as, and may be stored as, computer file 51. The values 0.012, 0.032, and 0.014 are capacitance (Marked as "cap") of exemplary nets Net1, Net2, and Net3, respectively. The capacitance ("ca") values include C_worse values, C_best values, or C_nominal values. File 51 may be stored on a tangible non-transitory storage medium. Steps 72 through 80 are essentially the same as the corresponding steps in FIG. 5, and hence are not repeated herein.

Figure 11:
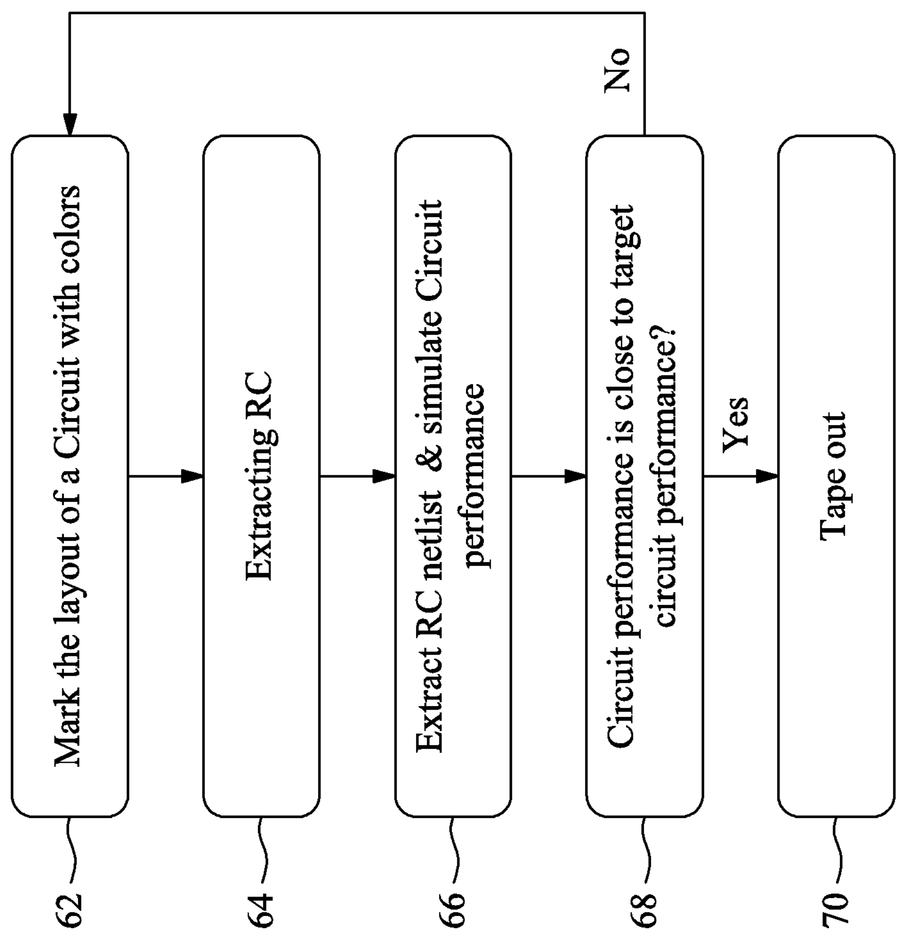
FIG. 11 illustrates an exemplary process flow for optimizing circuit design through the modification of mask designators in accordance with some embodiments.

FIG. 11 illustrates an exemplary process flow for optimizing circuit. First, a circuit is designed, and the layout is drawn. The layout is marked with colors (step 62) (or other mask designators) to indicate which nets in the layout will be decomposed into which lithography masks of a double patterning mask set. Next, as represented by step 64, the steps shown in block 60 in either FIG. 5 or FIG. 8 are performed. The respective RC netlists are extracted (step 66). During the extraction, steps 40 and 42 in FIGS. 5 and 8 are performed. Accordingly, the color information (the mask designator) affects the values in the netlists. Next, as also shown in step 66, the performance (such as the timing) of the circuit is simulated using the netlists. The simulated performance is compared to the target performance (step 68). If the simulated performance meets the target performance, the circuit can be taped out (step 70). Otherwise, the process flow loops back to step 62, wherein the layout is modified, with the colors of the nets changed. Steps 64, 66, and 68 are then performed on the updated layout to determine whether the performance of the circuit with the updated layout meets the target performance requirement. The loop continues until eventually, the target performance is met.

In the above discussed process, the term "nominal," "best," and "worst" are considered as at a typical process corner, that is, the nominal values are assumed as being the same as target values of design, and the best and the worst values are the best values and the worst values relative to the target values. For example, if a metal line is intended to have a target value of 1 nm, then 1 nm is the nominal value at the typical process corner. Similarly, if a spacing S is intended to be 10 nm, then 10 nm is the nominal value at the typical process corner. Whether width W or spacing S (which deviates from the nominal values) is a worst or a best value is determined by whether this value causes the capacitance of the respective metal line to increase or decrease. If the respective capacitance increases, the respective width W and spacing S are worse values (than the nominal values), and can be potentially worst values. If the respective capacitance decreases, the respective width W and spacing S are better values (than the nominal values), and can be potentially best values. Accordingly, the worst widths W are greater than the respective nominal width, the best widths W are smaller than the respective nominal width, the worst spacings S are smaller than the respective nominal spacing, and the best spacings are greater than the respective nominal spacing.

Figure 12:
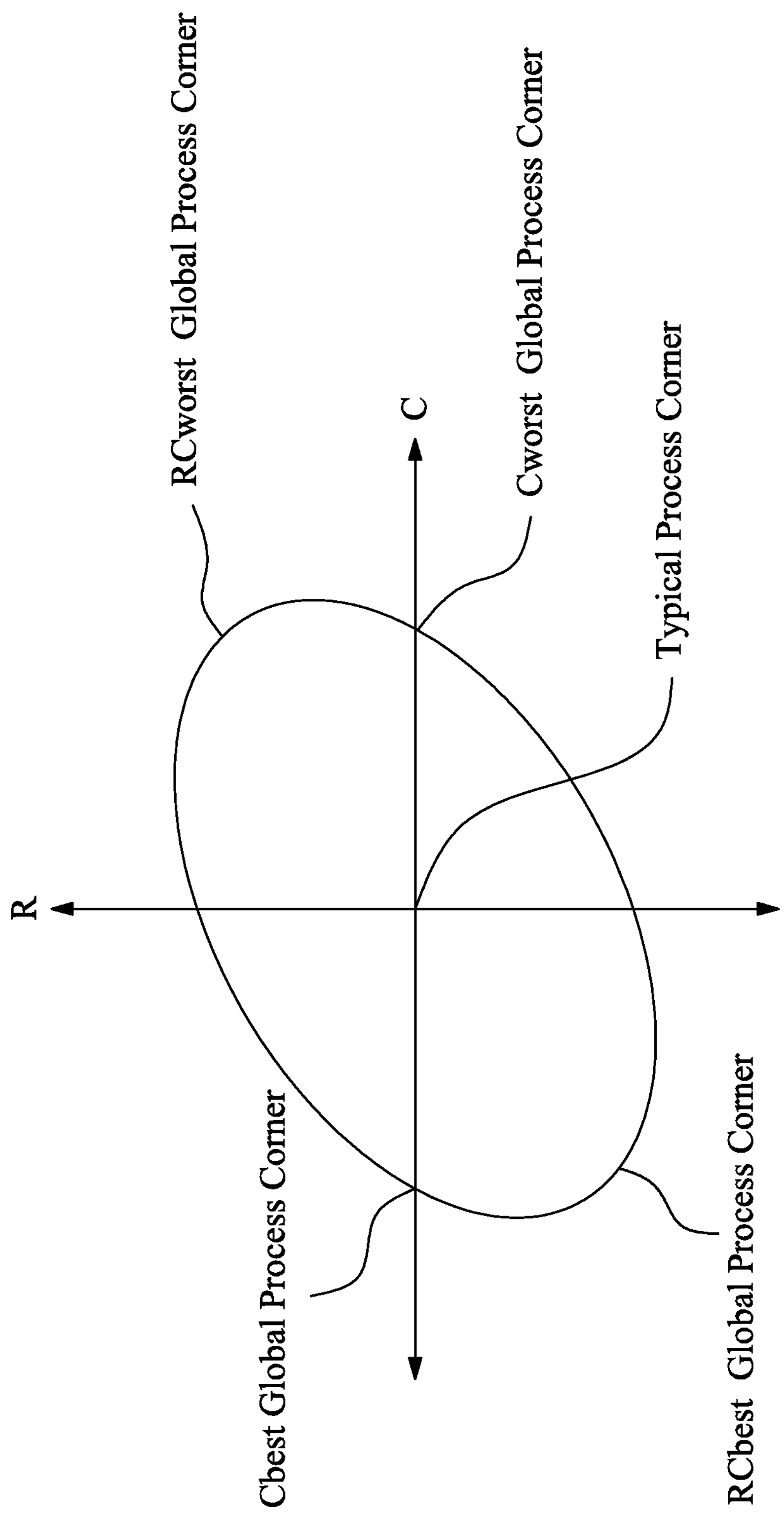
FIG. 12 illustrates exemplary global process corners in accordance with some embodiments.

There may be different global process corners in production. For example, FIG. 12 illustrates a RC map, wherein five global process corners are marked, namely typical process corner, Cworst global process corner (alternatively referred to as worst-capacitance global process corner), Cbest (alternatively referred to as best-capacitance global process corner), RCworst global process corner (alternatively referred to as worst-RC global process corner), and RCbest global process corner (alternatively referred to as best-RC global process corner). As addressed in preceding paragraphs, the global process corners represent the maximum variations of fabrication parameters in the fabrication of wafers, wherein the circuits on wafers still function correctly. The global process corners correspond to the likely process variations in the manufacturing of integrated circuits. For example, a wafer includes a plurality of dies. In different regions of the dies, the process variation may be different. In some regions of the wafers, the process variation will go to the Cworst global process corner. For example, the metal lines in these regions become widest, and the spacing becomes smallest. Accordingly, when the process goes to the Cworst global process corner, the capacitance is the worst (highest) among all global process corners. Alternatively stated, when a region of wafer goes to the Cworst global process corner, the capacitance in the region becomes worst compared to all other global process corners. In other regions of the wafer, the process variation process occurs in accordance with the Cbest global process corner, wherein the metal lines in these regions become narrowest, and the spacing becomes greatest. Accordingly, when the process occurs in accordance with the C_best global process corner, the capacitance is the best (lowest) among all global process corners. Alternatively stated, when a region of wafer goes to the Cbest global process corner, the capacitance in the region becomes best compared to all other global process corners.

In other regions of the wafer, the process variation occurs in accordance with the typical process corner. At the typical process corner, the width and the spacing of metal lines in these regions have the target values as designed. Accordingly, when the process goes to the typical process corner, the capacitance values will be as expected (although the parasitic capacitance is not intended). Similarly, in yet other regions of the wafer, the process variation occurs in accordance with the RCworst global process corner or RCbest global process corner. At the RCworst global process corner, the RC values in these regions may be the worst—among all global process corners.

It is noted that at each of the global process corners, the width W and spacing S have their own nominal values. The nominal values of one global process corner may be different from the nominal values of other global process corners. For example, the nominal width W of the Cworst global process corner is greater than the nominal width W of the typical global process corner, which is further greater than the nominal width W of the Cbest global process corner. Conversely, the nominal spacing S of the Cworst global process corner is smaller than the nominal spacing S of the typical process corner, which is further smaller than the nominal spacing S of the Cbest global process corner. At each of the global process corners, width W further deviates from its nominal width W in a range. Accordingly, for each of the global process corners, there is a greatest width W greater than the respective nominal width W, and a smallest width W smaller than the respective nominal width W. Similarly, for each of the global process corners, there is a greatest spacing S greater than the respective nominal spacing S, and a smallest spacing S smaller than the respective nominal spacing S. The nominal values of each of the global process corners and the deviation of widths W and spacings S in each of the global process corners relative to the respective nominal values may be found from sample chips and from simulations, and from previous manufacturing experiences.

Figure 13A:
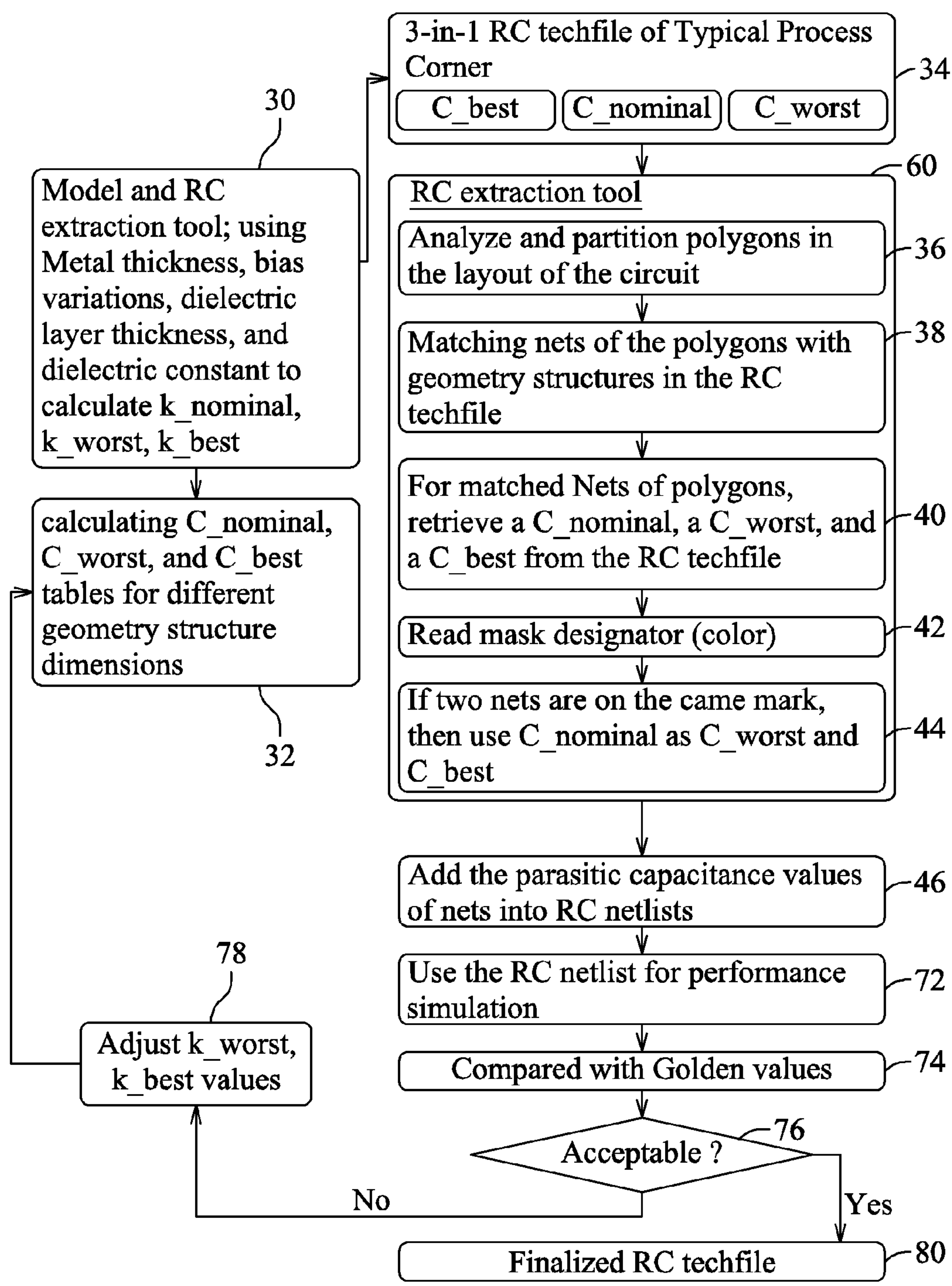
FIGS. 13A, 13B, 13C, 13D, and 13E illustrate the process flows for the construction of 3-in-1 RC techfiles and RC netlists for various global process corners in accordance with some embodiments.
Figure 13B:
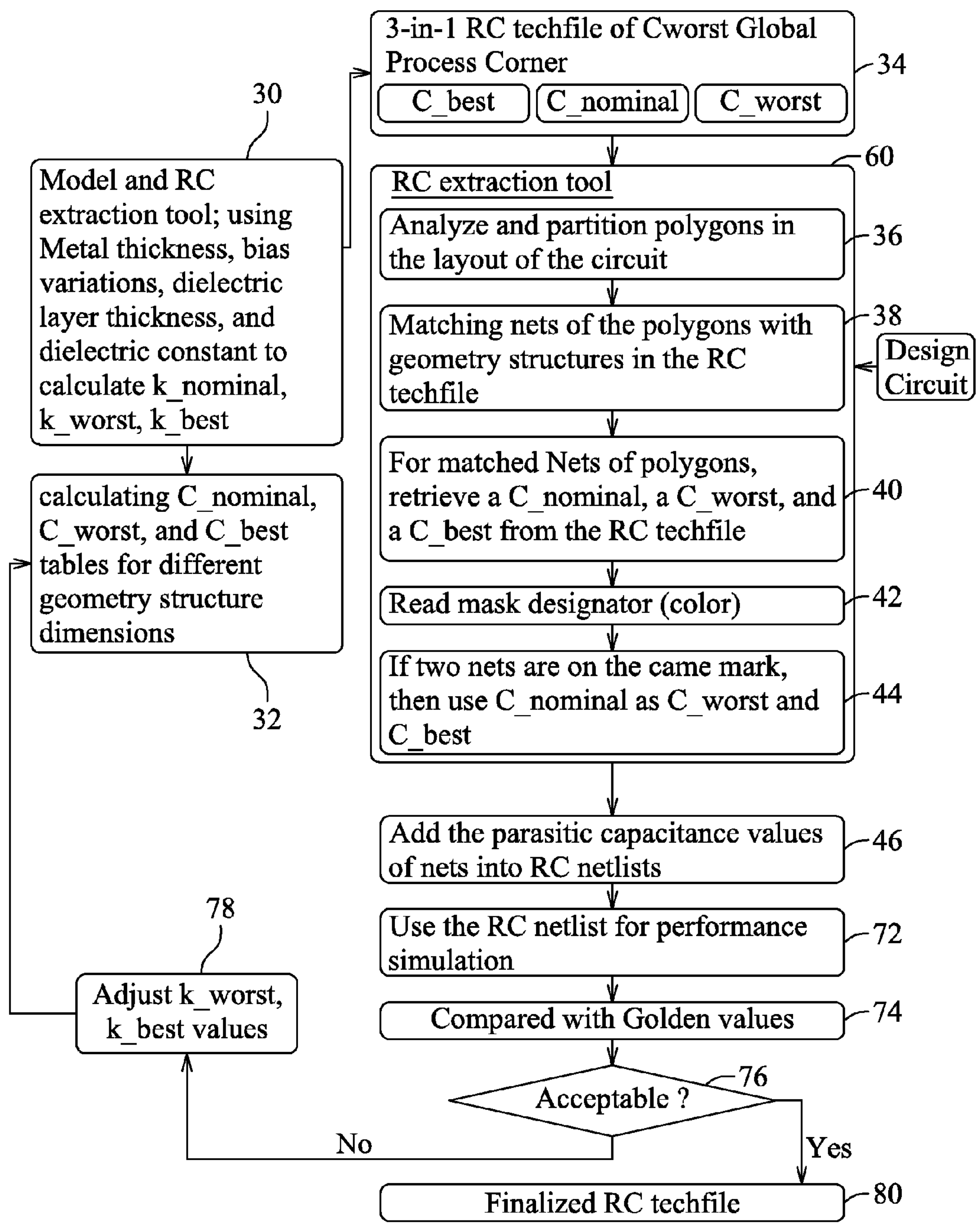
Figure 13C:
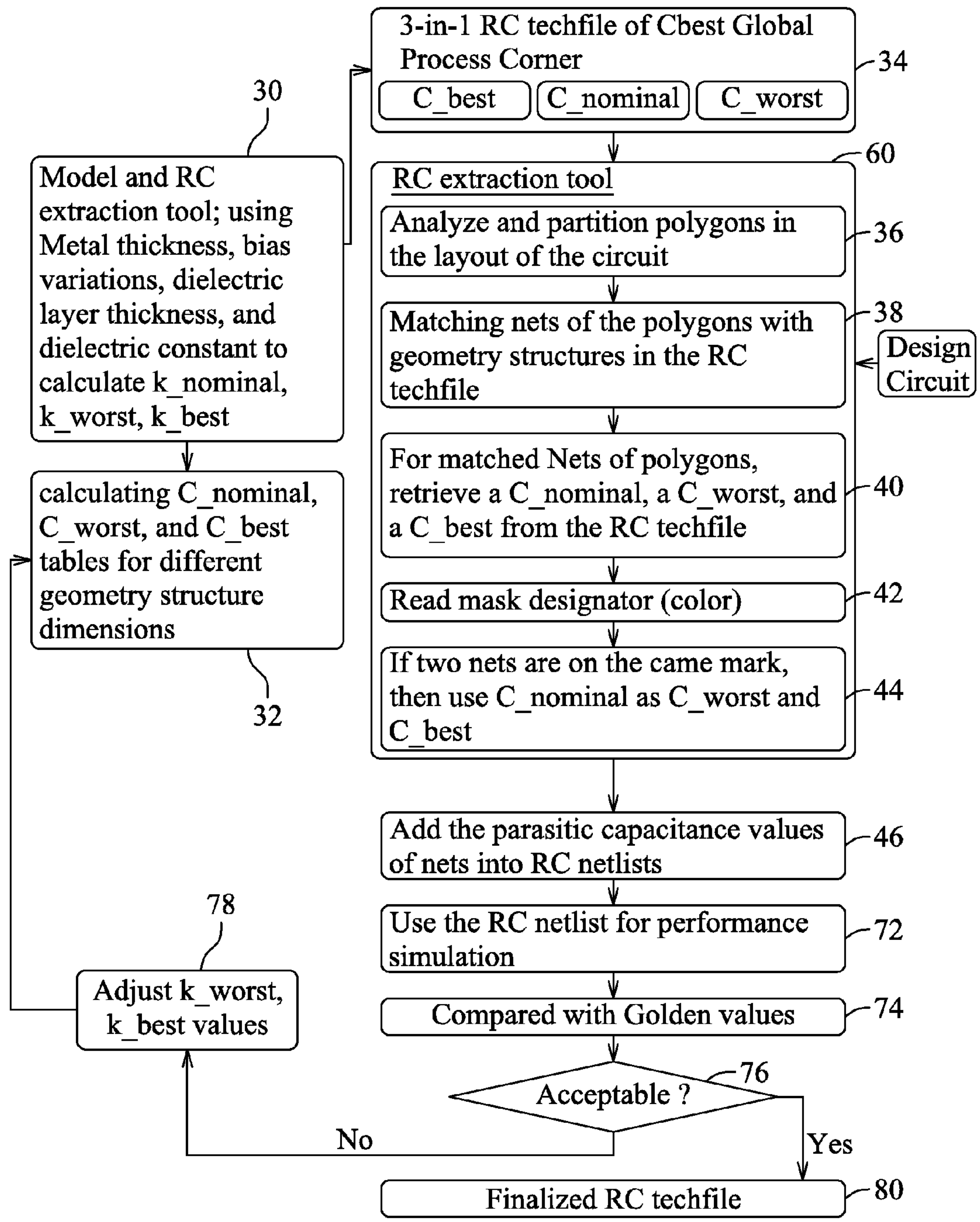
Figure 13D:
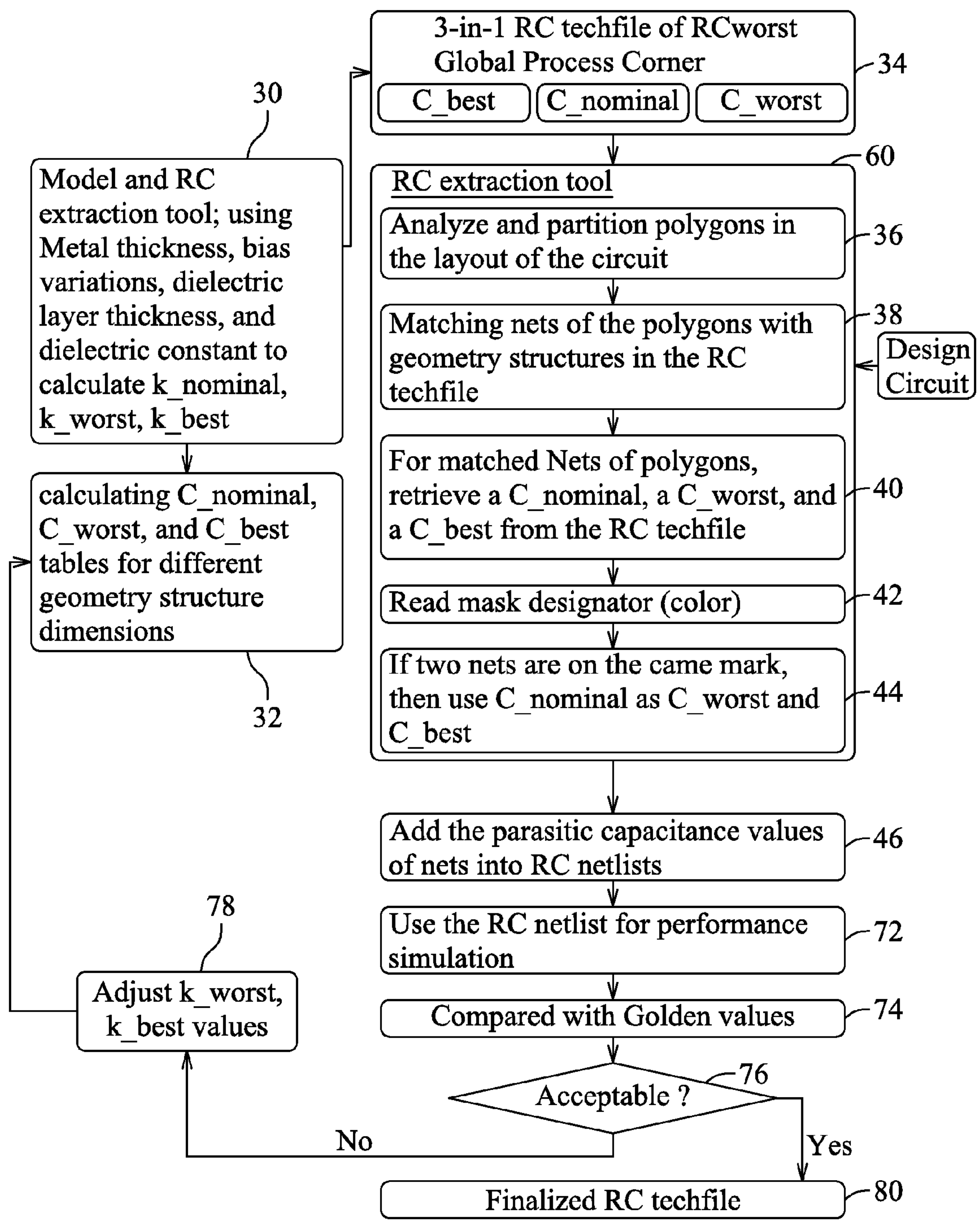
Figure 13E:
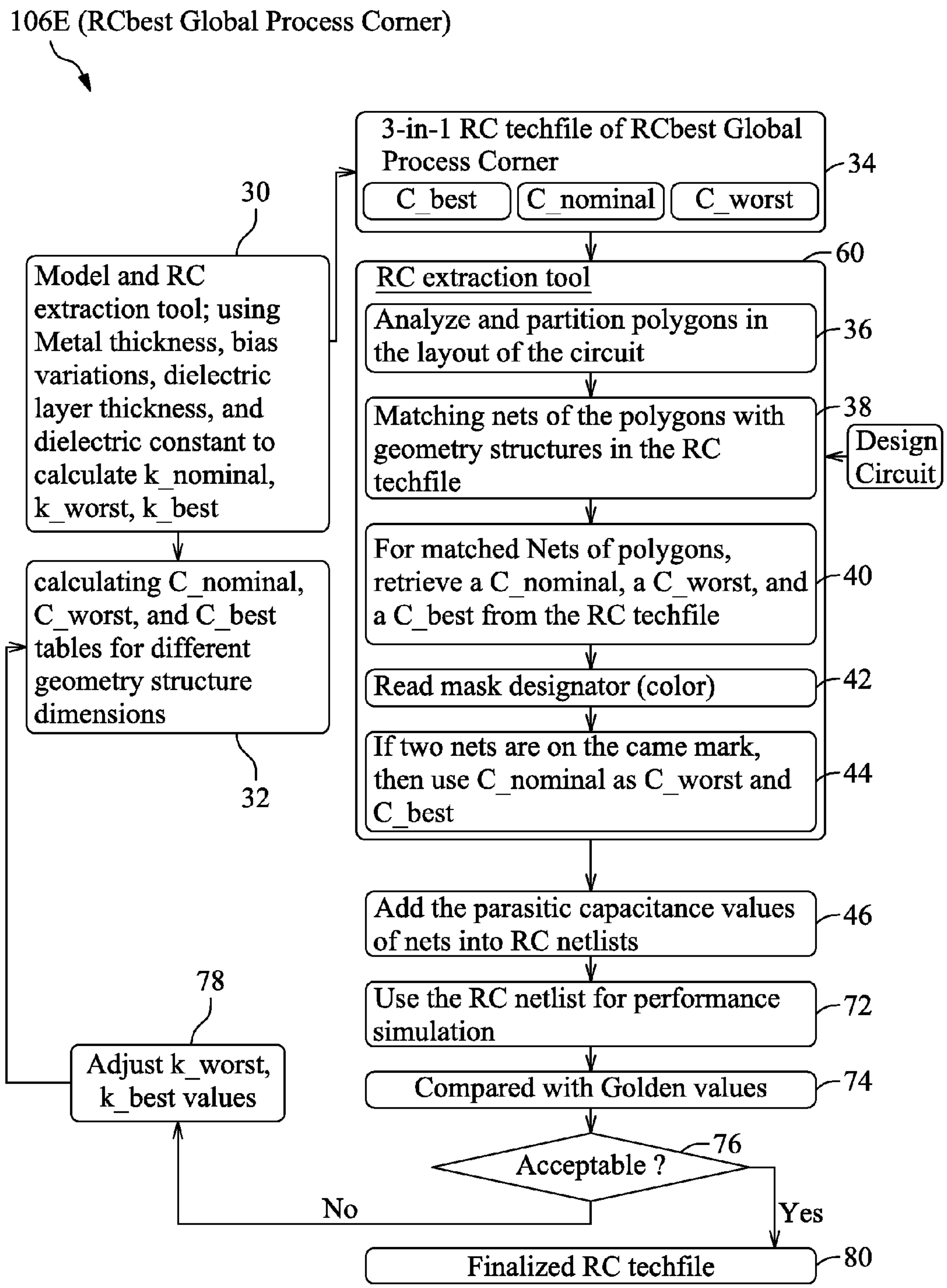

For each of the global process corners, the process steps in FIG. 5 may be performed. Accordingly, for each of the global process corners, there may be a 3-in-1 techfile and a corresponding RC netlist generated. FIGS. 13A through 13E illustrate the respective process steps, wherein FIG. 13A shows the process flow 106A and the 3-in-1 techfile and the RC netlist for the typical global process corner, FIG. 13B shows the process flow 106B and the 3-in-1 techfile and the RC netlist for the Cworst global process corner, FIG. 13C shows the process flow 106C and the 3-in-1 techfile and the RC netlist for the Cbest global process corner, FIG. 13D shows the process flow 106D and the 3-in-1 techfile and the RC netlist for the RCworst global process corner, and FIG. 13E shows the process flow 106E and the 3-in-1 techfile and the RC netlist for the RCbest global process corner.

In each of FIGS. 13A through 13E, the respective 3-in-1 RC techfile will also have three capacitance values C_best, C_nominal, and C_worst. However, the C_nominal of one global process corner is specific to the respective global process corner, and will be different from the C_nominal values of other global process corners. The C_best values are the best capacitance values caused by the deviation of metal line width W and spacing S deviated from the respective nominal values W and S. The C_worst values are the worst capacitance values caused by the deviation of metal line width W and spacing S deviated from the respective nominal values W and S.

An example is used below to explain the global process corners and respective RC techfiles in detail, as follows. This example addresses the typical process corner and the Cworst global process corner. The teaching, however, is readily available for other global process corners.

First, regarding the typical process corner, the steps of shifting masks gradually, and calculating the respective C_nominal, C_worst, and C_best capacitance values, as discussed with reference to FIG. 2, is performed, wherein the width W and spacing S values are the target values as intended by design. Accordingly, using the method described for FIGS. 3A through 4C, a plurality of tables is generated. The respective steps are shown as steps 32 and 34 as in FIG. 13A.

By changing width W and spacing S to different values, and by shifting masks gradually, and calculating the respective C_nominal, C_worst, and C_best capacitance values, as described with reference to FIG. 2 and Equation 1, the table in FIG. 14A may be obtained. In the table in FIG. 14A, each of widths W1, W2, and W3 and spacings S1, S2, S3, and S4 are target values that are intended by design. For example, widths W1, W2, and W3 may be 1 nm, 2 nm, and 3 nm, respectively, and spacings S1, S2, S3, and S4 may be 10 nm, 20 nm, 30 nm, and 40 nm respectively. The nominal k values for the typical process corner are thus obtained. At the typical process corner, width W and spacing S may still deviate from the target values. Using the highest possible deviations from the nominal values, the k_worst table similar to FIG. 3A is obtained. The resulting table is shown in FIG. 14A.

For example, as discussed above, at the typical process corner, the nominal widths W1, W2, and W3 may be 1 nm, 2 nm, and 3 nm, respectively, and the nominal spacings S1, S2, S3, and S4 may be 10 nm, 20 nm, 30 nm, and 40 nm respectively. It is assumed that at the typical process corner, the widths may be deviated to be greater by maximum 10 percent. The worst widths W1, W2, and W3 are thus 1.1 nm, 2.2 nm, and 3.3 nm, respectively. In the table in FIG. 14A (and the table in FIG. 16A), a "+" sign is appended to each of the widths W1, W2, and W3 to indicate that these width values are greater than the respective nominal values. It is further assumed that at the typical process corner, the spacing may deviate to be smaller by maximum 10 percent. The worst spacings S1, S2, S3, and S4 are thus 9 nm, 18 nm, 27 nm, and 36 nm, respectively. In the table in FIG. 14A (and the table in FIG. 16A), a "−" sign is appended to each of the spacings S1, S2, S3, and S4 to indicate that these spacing values are smaller than the respective nominal values. Therefore, using the widths W1+, W2+, W3+ and spacings S1−, S2−, S3−, and S4−, and by shifting masks gradually, and calculating the respective C_nominal, C_worst, and C_best capacitance values, as described with reference to FIGS. 2 and 3A, the table in FIG. 14A, which includes the worst k values, is obtained for the typical process corner.

The table in FIG. 14B, which includes the best k values, is also generated for the typical process corner. Similarly, it is assumed that at the typical process corner, the widths may deviate to be smaller by maximum 10 percent from the respective nominal width. The worst widths W1, W2, and W3 are thus 0.9 nm, 1.8 nm, and 2.7 nm, respectively. In the table in FIG. 14B (and the table in FIG. 16B), a "−" sign is appended to each of the widths W1, W2, and W3 to indicate that these width values are smaller than the respective nominal values. It is further assumed that at the typical process corner, the spacing may deviate to be greater by maximum 10 percent. The worst spacings S1, S2, S3, and S4 are thus 11 nm, 22 nm, 33 nm, and 44 nm, respectively. Therefore, using the widths W1−, W2−, W3− and spacings S1+, S2+, S3+, and S4+, and using the method described for FIGS. 2 and 3B, the table in FIG. 14B, which includes the best k values, is obtained for the typical process corner.

For the typical process corner, a set of tables, as shown in FIGS. 15A through 15C, are generated using the same method describe for FIGS. 4A through 4C. The details are not repeated herein. Accordingly, a set of capacitance tables are obtained, and the 3-in-1 as in step 34 of FIG. 13A is generated. The steps 34 through 80 as shown in FIG. 13A may then be performed for the typical process corner.

Next, the example for constructing the 3-in-1 techfile and the respective RC netlist for the Cworst global process corner is discussed. It is still assumed that the nominal widths W1, W2, and W3 at the typical process corner are 1 nm, 2 nm, and 3 nm, respectively, and the nominal spacings S1, S2, S3, and S4 at the typical process corner are 10 nm, 20 nm, 30 nm, and 40 nm respectively. It is further assumed that previous manufacturing experiences or simulation results indicate that the nominal widths W1, W2, and W3 of the Cworst process corner are 1.2 nm, 2.4 nm, and 3.6 nm, respectively, and the nominal spacings S1, S2, S3, and S4 of the Cworst global process corner are 8 nm, 16 nm, 24 nm, and 32 nm, respectively.

As discussed, in the Cworst global process corner, the widths W and spacings S also deviate from the nominal values of the global process corner. It is assumed that at the Cworst global process corner, the widths may be deviated to be greater by maximum 10 percent from the respective nominal values 1.2 nm, 2.4 nm, and 3.6 nm, respectively. The worst widths W1, W2, and W3 at the Cworst global process corner are thus 1.32 nm, 2.64 nm, and 3.96 nm, respectively. It is further assumed that at the Cworst global process corner, the spacing may deviate to be smaller by maximum 10 percent from the respective nominal values 8 nm, 16 nm, 24 nm, and 32 nm respectively. The worst spacings S1, S2, S3, and S4 are thus 7.2 nm, 14.4 nm, 21.6 nm, and 28.8 nm, respectively. Therefore, using the widths W1+, W2+, W3+ and spacings S1−, S2−, S3−, and S4− as shown in FIG. 16A, and using the method described for FIGS. 2 and 3A, the table in FIG. 16A, which includes the worst k values, is obtained for the Cworst global process corner.

The table in FIG. 16B, which includes the best k values, are also generated for the Cworst global process corner. Similarly, it is assumed that at the Cworst global process corner, the widths may deviate to be smaller by maximum 10 percent from the respective nominal values 1.2 nm, 2.4 nm, and 3.6 nm. The worst widths W1, W2, and W3 are thus 1.08 nm, 2.16 nm, and 3.24 nm, respectively. It is further assumed that at the Cworst global process corner, the spacing may deviate greater by maximum 10 percent, then the worst spacings S1, S2, S3, and S4 are 8.8 nm, 17.6 nm, 25.4 nm, and 35.2 nm, respectively. Therefore, using the widths W1−, W2−, W3− and spacings S1+, S2+, S3+, and S4+, and using the method described for FIGS. 2 and 3B, the table in FIG. 16B, which includes the best k values, is obtained for the Cworst global process corner.

For the Cworst global process corner, a set of tables, as shown in FIGS. 17A through 17C, are generated using the same method described for FIGS. 4A through 4C. The details are hence not repeated herein. Accordingly, a set of capacitance tables are obtained. The 3-in-1 table is obtained, as shown in box 34 of FIG. 13B. The steps 34 through 80 as shown in FIG. 13B may then be performed for the global process corner.

Using the similar method as described for the Cworst global process corner, the 3-in-1 techfile and the RC netlist for the Cbest global process corner, the RCworst global process corner, and the RCbest global process corner may also be obtained. The respective steps are shown as process flows 106D, 106D, and 106E in FIGS. 13C, 13D, and 13E, respectively.

In above-discussed embodiments, 3-in-1 techfiles (FIGS. 5, 8, and 13A-13E) are used. In alternative embodiments, not all of the nominal, worst, and best k values and capacitance values are generated. For example, at the Cworst global process corner, the C_best values may not be used since they have been covered by parts of other global process corners such as the typical process corner. Accordingly, Tables 16B and 17C are not constructed, and in process 106B in FIG. 13B, the resulting 3-in-1 techfile (step 34 in FIG. 13B) becomes a 2-in-1 techfile including the C_nominal and C_worst capacitance tables. Similarly, at the Cbest global process corner, the C_worst values may not be used since they have been covered by parts of other global process corners such as the typical process corner. Accordingly, Tables 16A and 17B are not constructed, and in process 106C in FIG. 13C, the resulting 3-in-1 techfile (step 34 in FIG. 13B) becomes a 2-in-1 techfile including the C_nominal and C_best capacitance tables.

The process steps as in the embodiments may be performed by a computer(s), which includes software and hardware. The intermediate and final results of the embodiments may be saved on a tangible non-transitory computer-readable medium such as hard drives, discs, and the like. For example, the various values such as k_worst, k_best, the techfile as shown in FIGS. 4A, 4B, and 4C, the integrated circuit layout, and the generated netlists may be saved on the non-transitory computer-readable medium. In addition, the steps as shown in FIGS. 5 and 8 may also be executed by a computer, which embodies program codes for performing the steps. The program codes may also be saved on a tangible non-transitory computer-readable medium such as hard drives, discs, and the like. Furthermore, In FIGS. 5 and 8, the steps in block 60 is performed by a RC extraction tool, which includes computer hardware and programming code embodied on a tangible non-transitory storage medium, such as a hard disk.

In accordance with some embodiments of the present disclosure, a method includes selecting a process corner, determining model parameters for forming an integrated circuit, and generating a techfile using the model parameters for the process corner. The generating the techfile is performed using a computer. The techfile includes at least two of a C_worst table, a C_best table, and a C_nominal table. The C_worst table stores greatest parasitic capacitances between layout patterns of the integrated circuit when lithography masks including the layout patterns shift relative to each other. The C_best table stores smallest parasitic capacitances between the layout patterns when the lithography masks shift relative to each other. The C_nominal table stores nominal parasitic capacitances between the layout patterns when the lithography masks do not shift relative to each other to a nominal position.

In accordance with alternative embodiments of the present disclosure, a method includes analyzing polygons in a layout of an integrated circuit, and partitioning the polygons into nets, wherein the partitioning the polygons is performed using a computer. The method further includes finding at least one parasitic capacitance of each of the nets from a techfile, wherein the techfile includes at least two of a C_worst table, a C_best table, and a C_nominal table. The C_worst table stores greatest parasitic capacitances between layout patterns of the integrated circuit when lithography masks including the layout patterns shift relative to each other. The C_best table stores smallest parasitic capacitances between the layout patterns when the lithography masks shift relative to each other. The C_nominal table stores nominal parasitic capacitances between the layout patterns when the lithography masks do not shift relative to each other or shift to a nominal position. During the step of finding, a width and a spacing of the each of the nets are used to index into at least one of the C_worst table, the C_best table, and the C_nominal table. The method further includes writing the at least one parasitic capacitance of each of the nets into netlists, simulating a performance value of the integrated circuit using the netlists, comparing the simulated performance value with a golden value to find a difference between the simulated performance value and the golden value, wherein the golden value is a simulated value or a value obtained from samples of the integrated circuit fabricated on chips, and adjusting the at least two of the C_worst table, the C_best table, and the C_nominal table to compensate for the difference.

In accordance with yet alternative embodiments of the present disclosure, a method includes selecting at least two process corners from a typical process corner, a Cworst global process corner, a Cbest global process corner, a RCworst global process corner, and a RCbest global process corner, analyzing polygons in a layout of an integrated circuit, wherein the analyzing the polygons is performed using a computer, and partitioning the polygons into nets. For each of the two process corners, the method further includes finding at least two of a worst capacitance, a best capacitance, and a nominal capacitance for each of the nets from a C_worst table, a C_best table, and a C_nominal table, respectively. The step of finding includes indexing into the C_worst table, the C_best table, and the C_nominal table using widths and spacings of the nets as indexes, wherein the worst capacitance is the highest capacitance between the net and neighboring nets when lithography masks including patterns of the net shifts relative to each other, the best capacitance is a lowest capacitance between the net and the neighboring nets when the lithography masks including the patterns of the net shifts relative to each other, the nominal capacitance is a capacitance between the net and the neighboring nets when the lithography masks including the patterns of the net do not shift relative to each other or shift to a nominal position. The C_worst table stores greatest parasitic capacitances between layout patterns of the integrated circuit when lithography masks including the layout patterns shift relative to each other. The C_best table stores smallest parasitic capacitances between the layout patterns when the lithography masks shift relative to each other. The C_nominal table stores nominal parasitic capacitances between the layout patterns when the lithography masks do not shift relative to each other or shift to a nominal position.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

selecting a process corner from an RC map comprising a typical process corner, a worst-capacitance global process corner, a best-capacitance global process corner, a worst-RC global process corner different from the worst-capacitance global process corner, and a best-RC global process corner different from the best-capacitance global process corner;

for the selected process corner, determining model parameters for forming an integrated circuit;

generating a file using the model parameters for the process corner, and wherein the file comprises at least two of a first capacitance table, a second capacitance table, and a third capacitance table, and wherein:

the first capacitance table stores greatest parasitic capacitances between layout patterns of the integrated circuit when lithography masks comprising the layout patterns shift relative to each other;

the second capacitance table stores smallest parasitic capacitances between the layout patterns when the lithography masks shift relative to each other; and the third capacitance table stores nominal parasitic capacitances between the layout patterns when the lithography masks do not shift relative to each other or shift to a nominal position;

generating a layout of the integrated circuit using at least the file, wherein at least one of the selecting the process corner, the determining the model parameters, the generating the file, and the generating the layout is performed using a computer; and forming the integrated circuit using the layout.

2. The method of claim 1, wherein the file comprises the third capacitance table, the first capacitance table, and the second capacitance table.

3. The method of claim 1, wherein the process corner is the worst-capacitance global process corner of the RC map, and wherein the file comprises the third capacitance table and the first capacitance table, and lacks the second capacitance table.

4. The method of claim 1, wherein the process corner is the best-capacitance global process corner of the RC map, and wherein the file comprises the third capacitance table and the second capacitance table, and lacks the first capacitance table.

5. The method of claim 1, wherein the generating the file comprises:

determining a maximum shift of a first lithography mask relative to a second lithography mask, wherein the first and the second lithography masks are comprised in a double patterning mask set;

selecting a shift magnitude smaller than the maximum shift, wherein the shift magnitude represents a shift of a first net in the first lithography mask relative to second nets in the second lithography mask;

calculating coupling capacitance values between the first net and each of the second nets;

calculating a total capacitance of the capacitance values;

repeating the steps of selecting, calculating the coupling capacitance values, and calculating the total capacitance, wherein in each cycle of the repeating, an additional shift magnitude different from the shift magnitude is selected, and an additional total parasitic capacitance is calculated;

selecting a greatest capacitance from the total parasitic capacitance and the additional total parasitic capacitance; and selecting a smallest capacitance from the total parasitic capacitance and the additional total parasitic capacitance.

6. The method of claim 5 further comprising converting the greatest capacitance and the smallest capacitance into an equivalent k_worst value and a k_best value, respectively, wherein the k_worst value represents a k value that causes a parasitic capacitance between the first net and one of the second nets to increase to the greatest capacitance when the first lithography mask shift relative to the second lithography mask, and wherein the k_best value represents a k value that causes a parasitic capacitance between the first net and one of the second nets to reduce to the smallest capacitance when the first lithography mask shift relative to the second lithography mask.

7. The method of claim 1 further comprising forming a k_worst table and a k_best table, wherein the k_worst table stores k_worst values of nets of metal lines as a function of different spacings and different widths, and wherein the k_best table stores k_best values of the nets as a function of the different spacings and the different widths.

8. The method of claim 7 further comprising calculating the first capacitance table and the second capacitance table from the k_worst table and the k_best table, respectively.

9. The method of claim 1 further comprising calculating the third capacitance table from a k_nominal value, wherein the k_nominal value is equal to a k value of a dielectric material between the layout patterns.

10. A method comprising:

analyzing polygons in a layout of an integrated circuit;

partitioning the polygons into nets; and finding at least one parasitic capacitance of each of the nets from a file, wherein the file comprises at least two of a first capacitance table, a second capacitance table, and a third capacitance table, and wherein:

the first capacitance table stores greatest parasitic capacitances between layout patterns of the integrated circuit when lithography masks comprising the layout patterns shift relative to each other;

the second capacitance table stores smallest parasitic capacitances between the layout patterns when the lithography masks shift relative to each other; and the third capacitance table stores nominal parasitic capacitances between the layout patterns when the lithography masks do not shift relative to each other or shift to a nominal position, wherein during the step of finding, a width and a spacing of the each of the nets are used to index into at least one of the first capacitance table, the second capacitance table, and the third capacitance table;

writing the at least one parasitic capacitance of each of the nets into netlists;

simulating a performance value of the integrated circuit using the netlists;

comparing the simulated performance value with a golden value to find a difference between the simulated performance value and the golden value; and adjusting the at least two of the first capacitance table, the second capacitance table, and the third capacitance table to compensate for the difference, wherein at least one of the analyzing, the partitioning, and the finding is performed using a computer.

11. The method of claim 10, wherein the finding at least one parasitic capacitance comprises, for at least one of the each of the nets, finding a worst-capacitance value form the first capacitance table, finding a best-capacitance value form the second capacitance table, and finding a nominal-capacitance value form the third capacitance table.

12. The method of claim 10, wherein the finding at least one parasitic capacitance comprises, for each of the nets, finding a worst-capacitance value from the first capacitance table, finding a best-capacitance value from the second capacitance table, and finding a nominal-capacitance value from the third capacitance table.

13. The method of claim 10, wherein the golden value is a simulated value or a value obtained from samples of the integrated circuit fabricated on chips.

14. The method of claim 10, wherein the file comprises the third capacitance table, the first capacitance table, and the second capacitance table.

15. The method of claim 10, wherein the finding, the writing, the simulating, and the comparing are formed for a Cworst global process corner, and wherein the file comprises the third capacitance table and the first capacitance table, and lacks the second capacitance table.

16. The method of claim 10, wherein the finding, the writing, the simulating, and the comparing are formed for a Cbest global process corner, and wherein the file comprises the third capacitance table and the second capacitance table, and lacks the first capacitance table.

17. A method comprising:

selecting at least two process corners from a typical process corner, a worst-capacitance global process corner, a best-capacitance global process corner, a worst-RC global process corner, and a best-RC global process corner;

analyzing polygons in a layout of an integrated circuit, wherein the analyzing the polygons is performed using a computer;

partitioning the polygons into nets; and for each of the two process corners, finding at least two of a worst capacitance, a best capacitance, and a nominal capacitance for each of the nets from a first capacitance table, a second capacitance table, and a third capacitance table, respectively, wherein the step of finding comprises indexing into the first capacitance table, the second capacitance table, and the third capacitance table using widths and spacings of the nets as indexes, wherein:

the worst capacitance is a highest capacitance between the net and neighboring nets when lithography masks comprising patterns of the net shifts relative to each other;

the best capacitance is a lowest capacitance between the net and the neighboring nets when the lithography masks comprising the patterns of the net shifts relative to each other;

the nominal capacitance is a nominal capacitance between the net and the neighboring nets when the lithography masks comprising the patterns of the net do not shift relative to each other or shift to a nominal position;

the first capacitance table stores greatest parasitic capacitances between layout patterns of the integrated circuit when lithography masks comprising the layout patterns shift relative to each other;

the second capacitance table stores smallest parasitic capacitances between the layout patterns when the lithography masks shift relative to each other; and the third capacitance table stores nominal parasitic capacitances between the layout patterns when the lithography masks do not shift relative to each other or shift to a nominal position.

18. The method of claim 17 further comprising:

reading mask designators of the nets from the layout; and replacing parasitic capacitance values of portions of the nets that have a same mask designator with nominal capacitances found from the third capacitance table.

19. The method of claim 17 further comprising writing the at least two of the worst capacitance, the best capacitance, and the nominal capacitance into netlists, wherein the worst capacitance, the best capacitance, and the nominal capacitance are associated with the each of the nets.

20. The method of claim 19 further comprising:

retrieving the worst capacitance, the best capacitance, and the nominal capacitance from the netlists; and simulating a worst performance, a best performance, and a nominal performance of the integrated circuit using the worst capacitance, the best capacitance, and the nominal capacitance, respectively.

* * * * *